United States Patent
Nowak

(10) Patent No.: US 6,610,576 B2
(45) Date of Patent: Aug. 26, 2003

(54) METHOD FOR FORMING ASYMMETRIC DUAL GATE TRANSISTOR

(75) Inventor: Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,316

(22) Filed: Dec. 13, 2001

(65) Prior Publication Data

US 2003/0111686 A1 Jun. 19, 2003

(51) Int. Cl.$^7$ ............................................. H01L 21/336
(52) U.S. Cl. ...................... 438/301; 438/286; 438/283; 438/299
(58) Field of Search ................................. 438/286, 305, 438/307, 152, 157, 179, 283, 164, 299, 586, 156, 268

(56) References Cited

U.S. PATENT DOCUMENTS

| 5,633,523 A | | 5/1997 | Kato | |
| 5,773,331 A | * | 6/1998 | Solomon et al. | 438/164 |
| 5,780,327 A | * | 7/1998 | Chu et al. | 438/156 |
| 6,030,861 A | | 2/2000 | Liu | |

FOREIGN PATENT DOCUMENTS

| JP | 6275788 A | | 4/1987 | |
| JP | 6310666 A | | 1/1988 | |
| JP | 7202011 A | | 8/1995 | |
| JP | 8037239 A | | 8/1996 | |
| JP | 09223676 | * | 8/1997 | ........... H01L/21/28 |
| JP | 92236761 | | 8/1997 | |
| JP | 10012748 | | 1/1998 | |
| JP | 11233644 | | 8/1999 | |

* cited by examiner

Primary Examiner—Carl Whitehead, Jr.
Assistant Examiner—Yennhu B Huynh
(74) Attorney, Agent, or Firm—Schmeiser, Olsen & Watts; Mark F. Chadurjian

(57) ABSTRACT

The present invention provides a double gated transistor and a method for forming the same that results in improved device performance and density. The preferred embodiment of the present invention provides a double gated transistor with asymmetric gate doping, where one of the double gates is doped degenerately n-type and the other degenerately p-type. By doping one of the gates n-type, and the other p-type, the threshold voltage of the resulting device is improved. Additionally, the preferred transistor design uses an asymmetric structure that results in reduced gate-to-drain and gate-to-source capacitance. In particular, dimensions of the weak gate, the gate that has a workfunction less attractive to the channel carriers, are reduced such that the weak gate does not overlap the source/drain regions of the transistor. In contrast the strong gate, the gate having a workfunction that causes the inversion layer to form adjacent to it, is formed to slightly overlap the source/drain regions. This asymmetric structure allows for the performance benefits of a double gate design without the increased capacitance that would normally result.

14 Claims, 24 Drawing Sheets

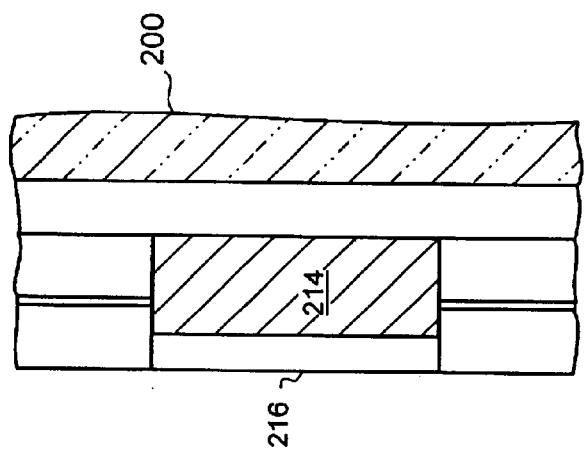
FIG. 5C
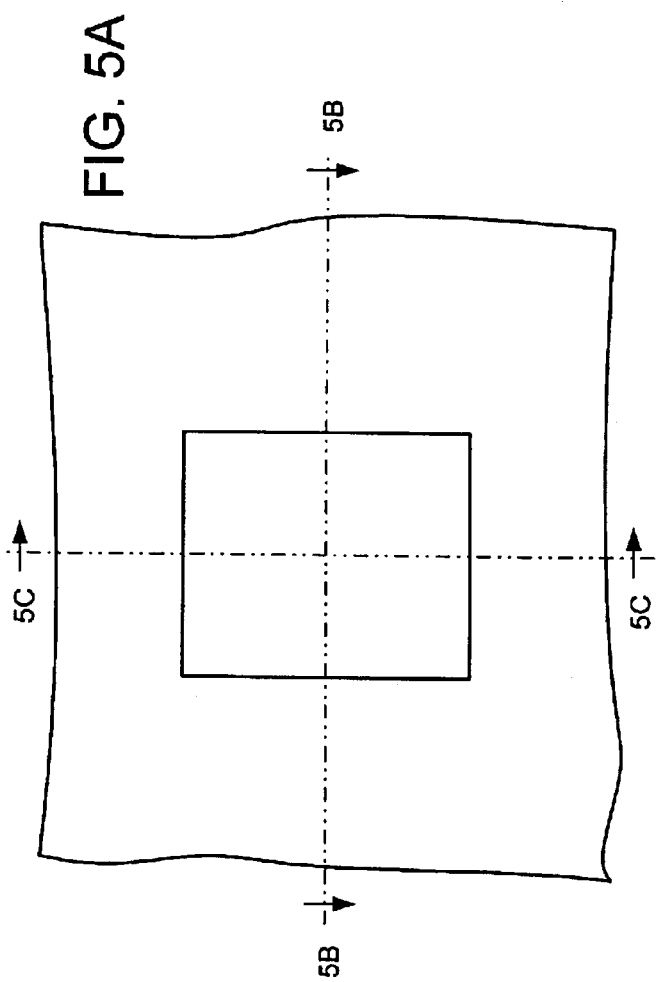
FIG. 5A
FIG. 5B
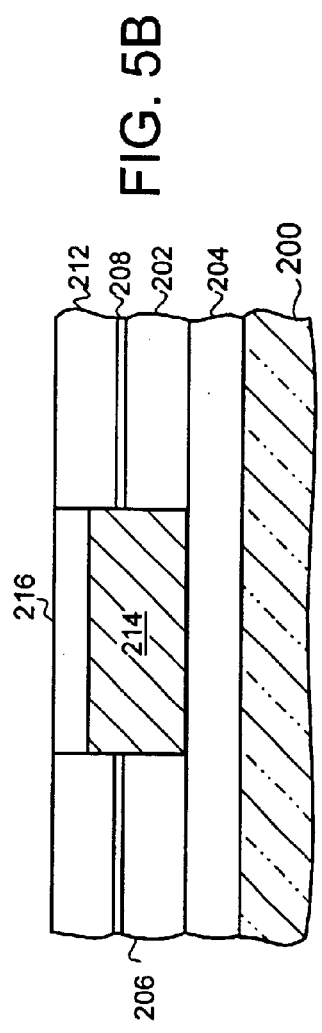

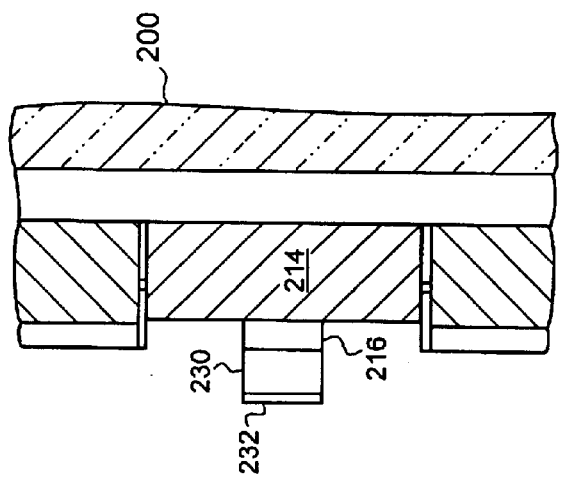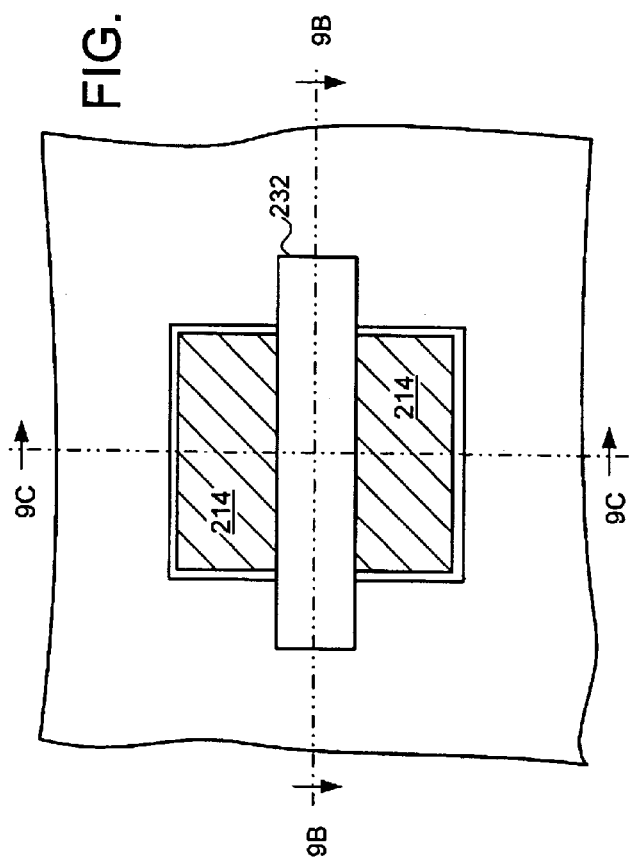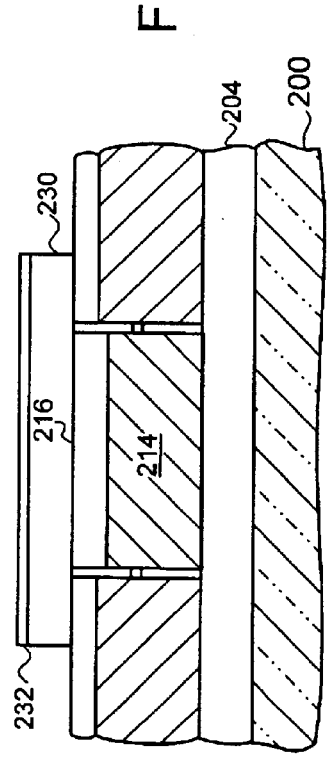

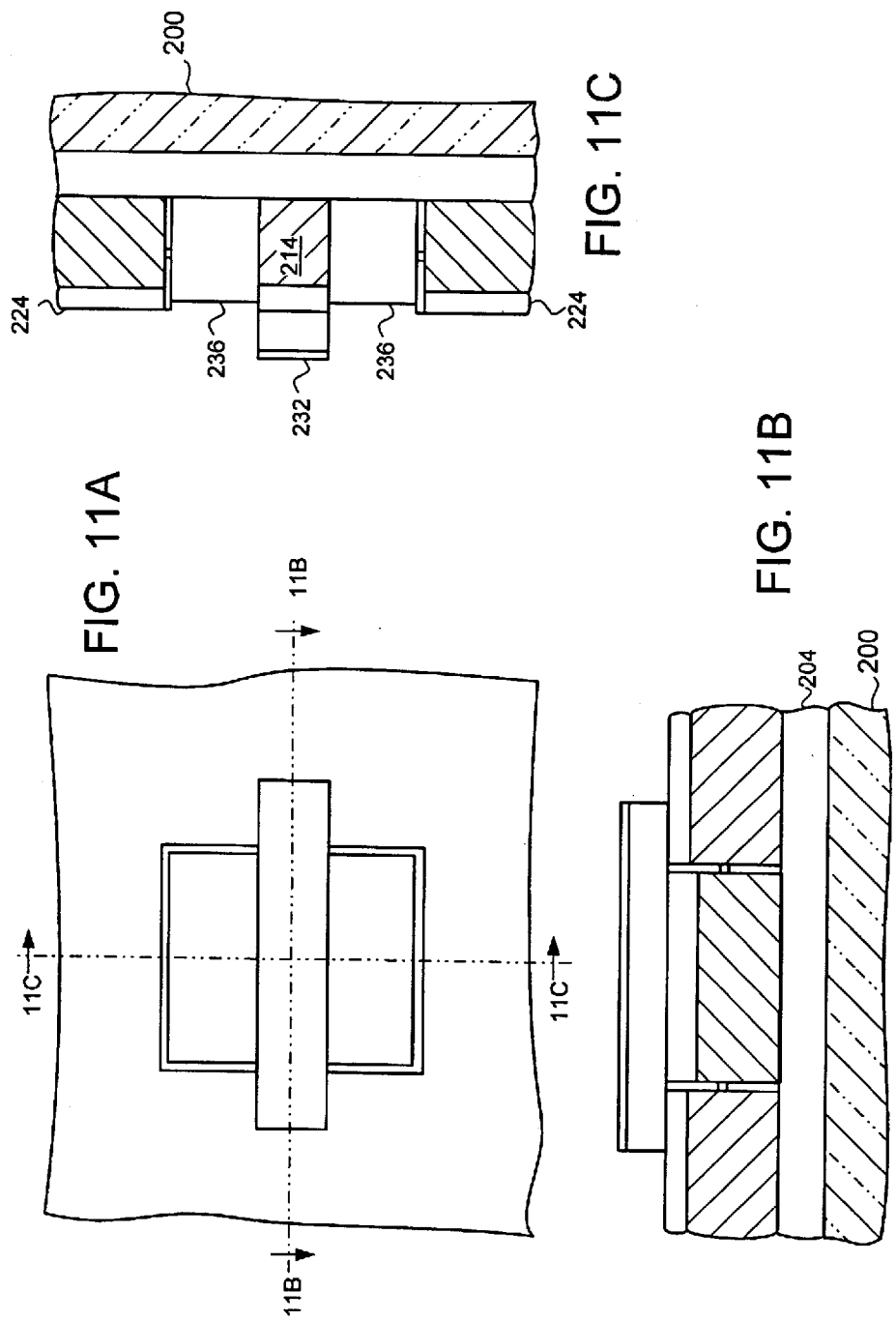

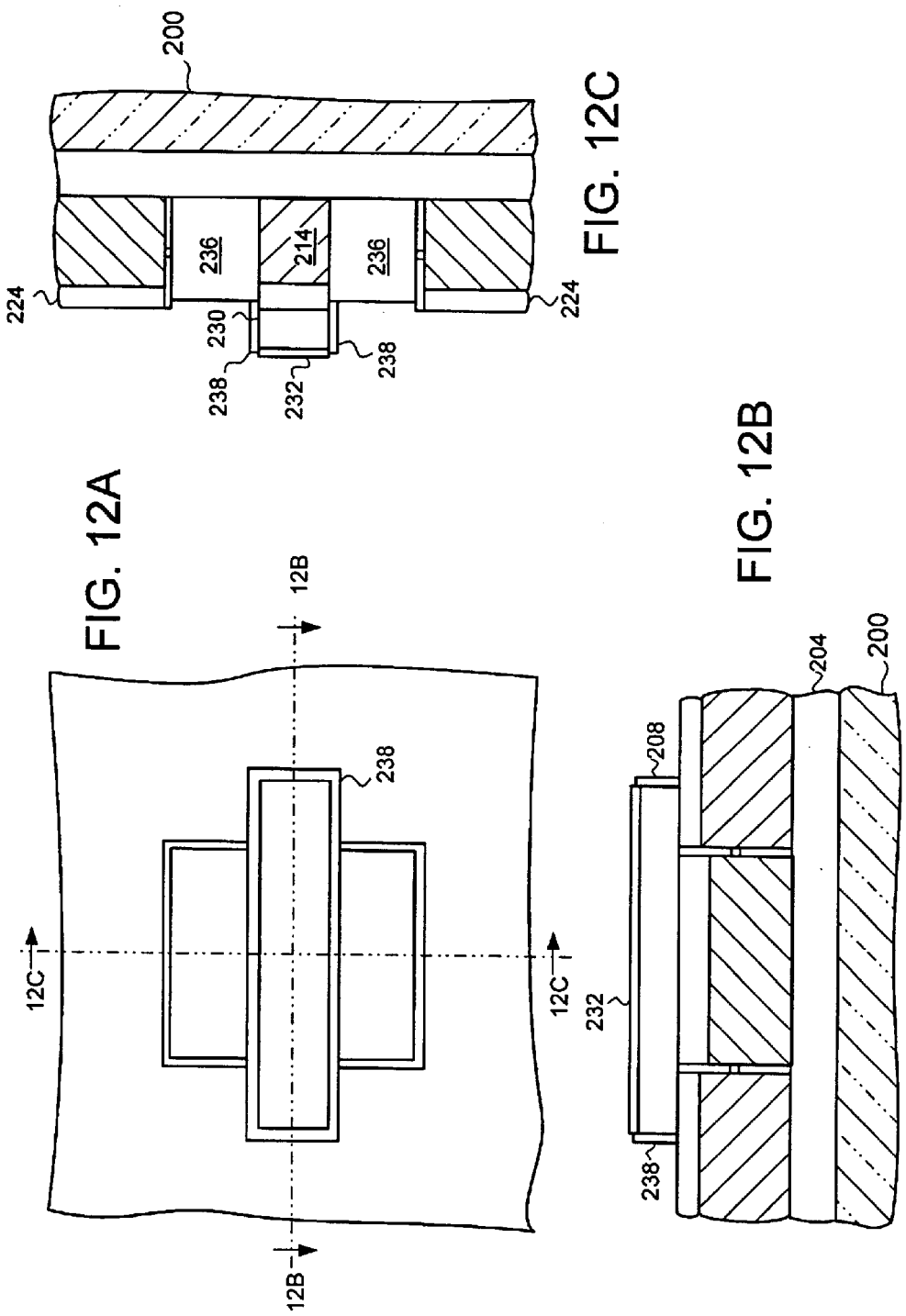

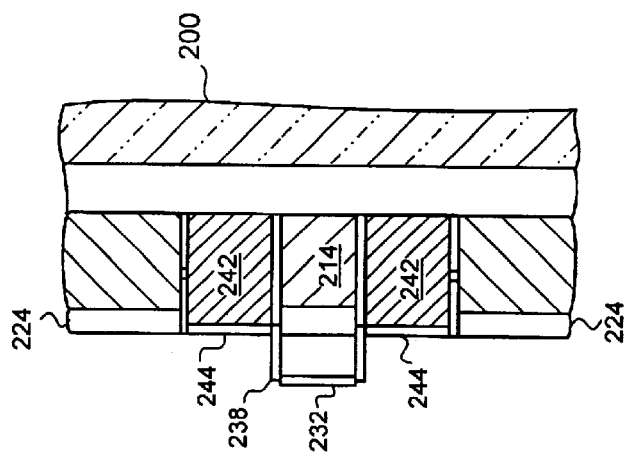
FIG. 14C
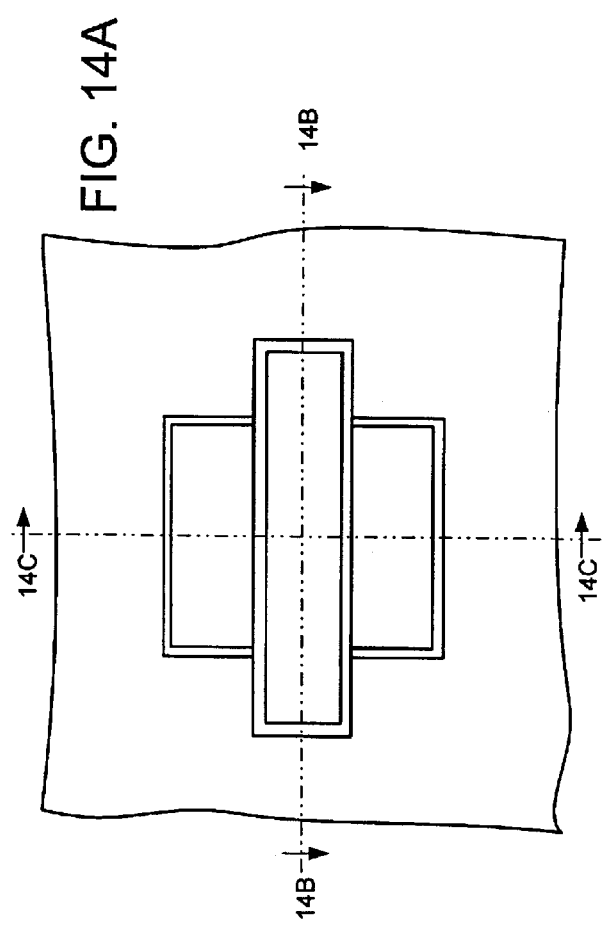
FIG. 14A
FIG. 14B

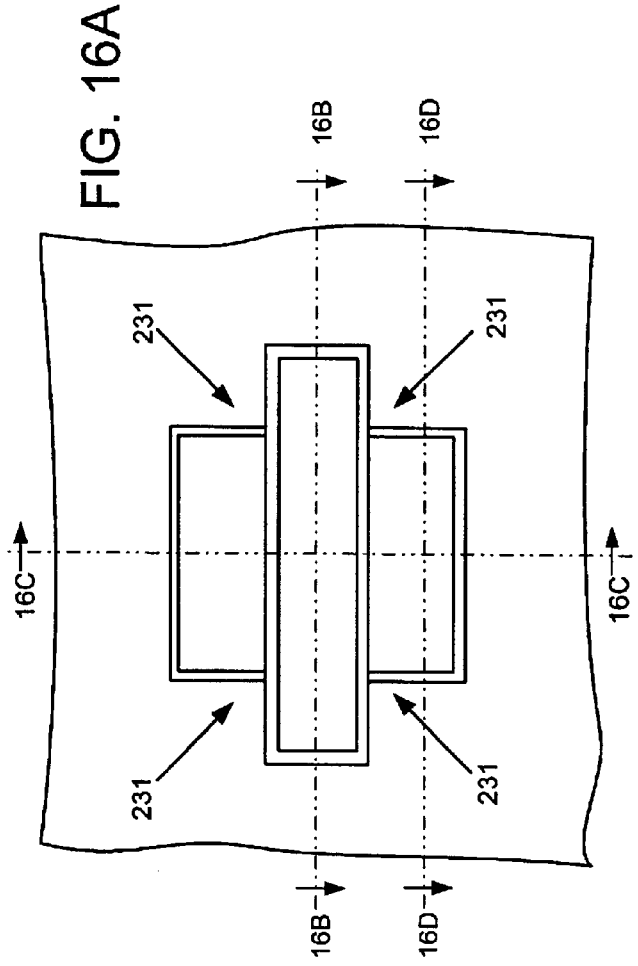
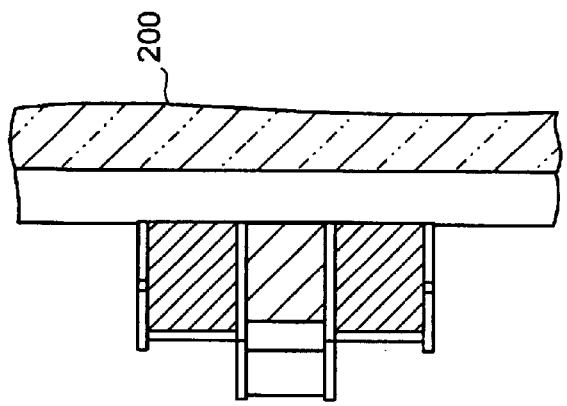
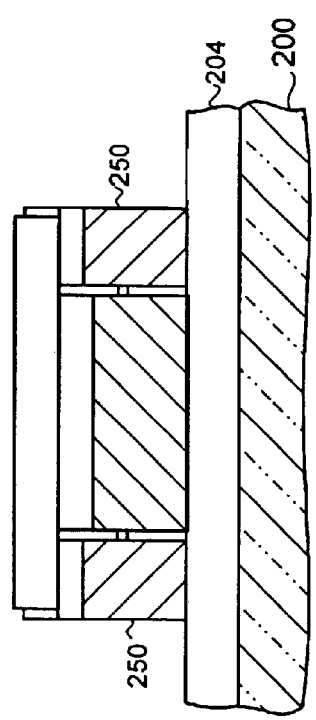

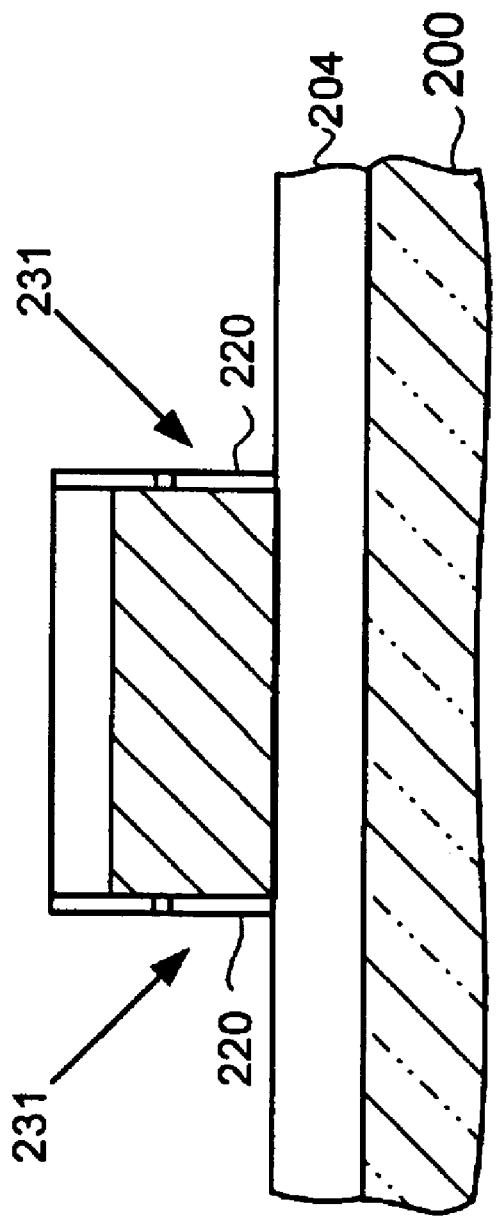

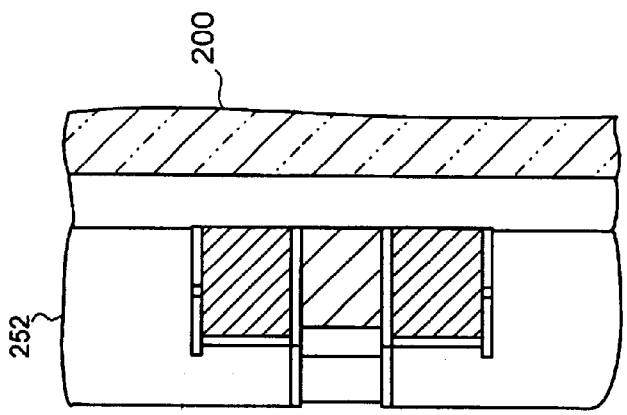
FIG. 17C
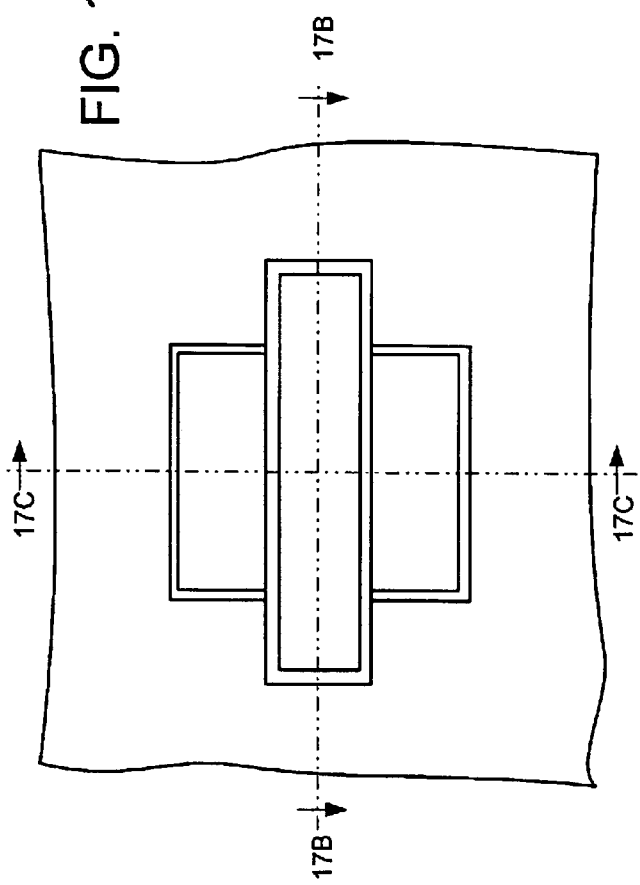
FIG. 17A
FIG. 17B
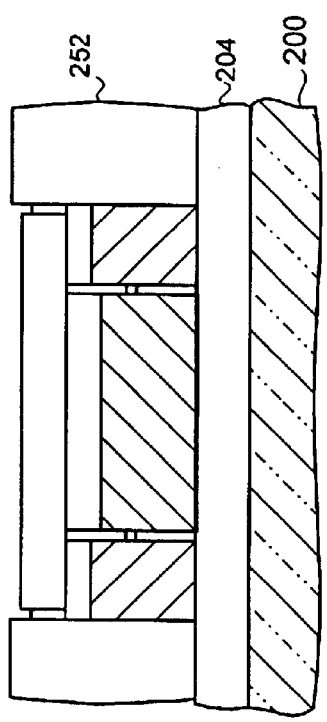

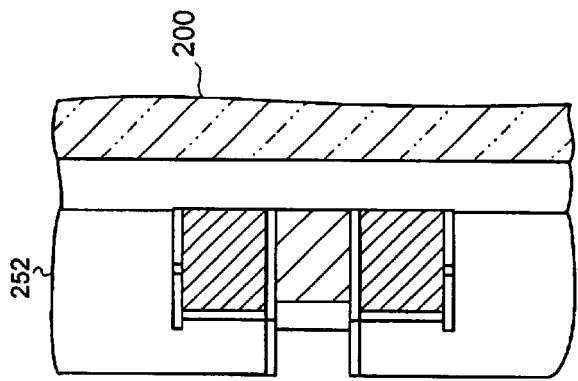
FIG. 18C
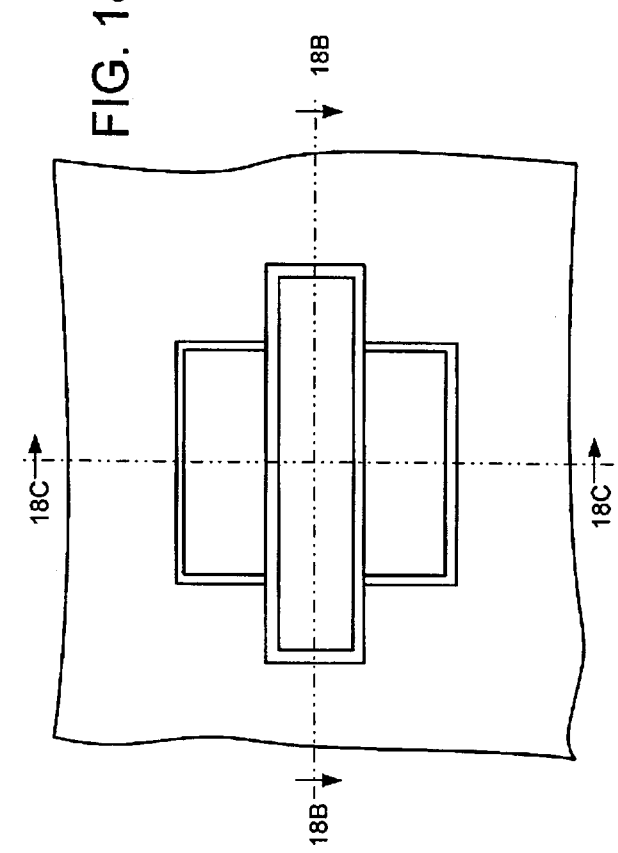
FIG. 18A
FIG. 18B

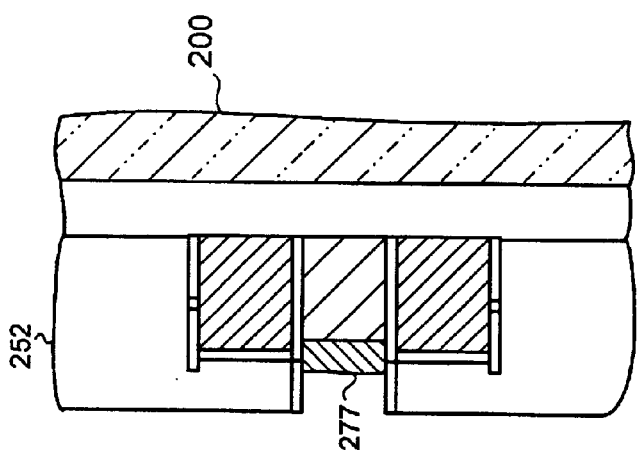
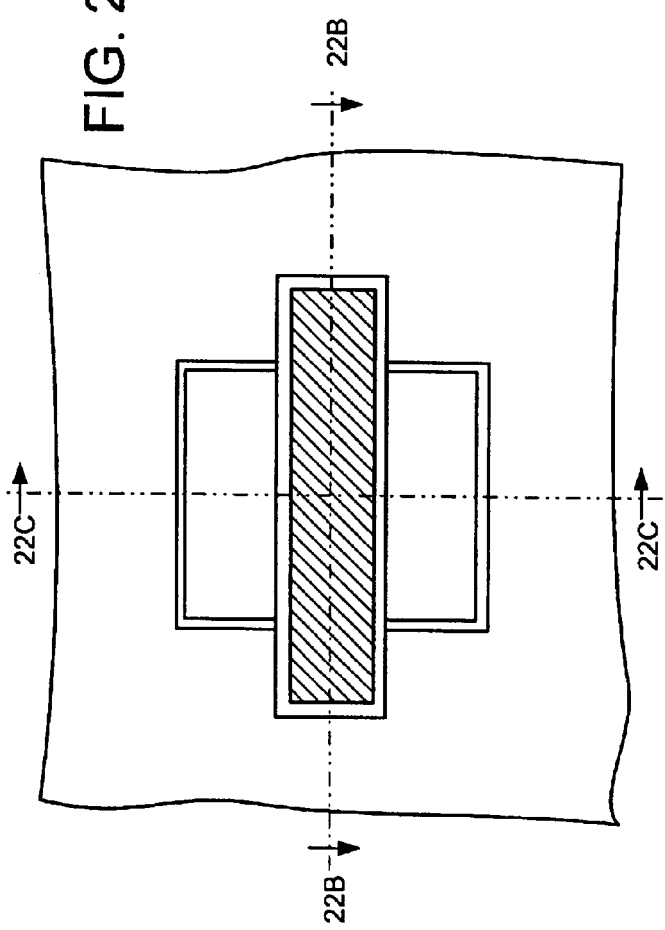
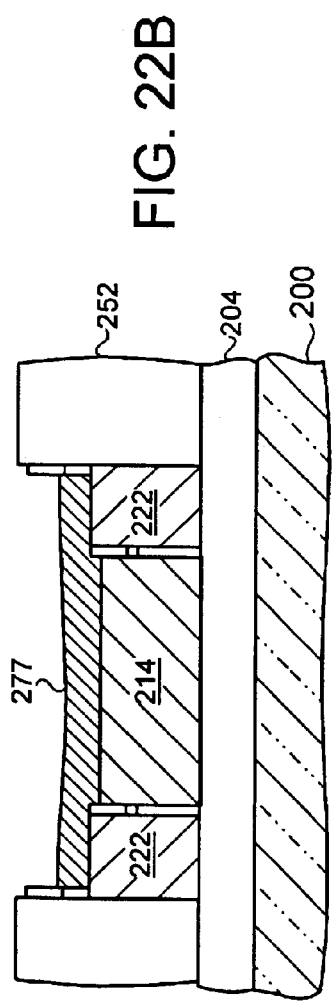
FIG. 22A
FIG. 22B
FIG. 22C

METHOD FOR FORMING ASYMMETRIC DUAL GATE TRANSISTOR

CROSS REFERENCE TO RELATED APPLICATIONS

Reference is made to co-pending U.S. patent application Ser. No. 09/683,328 entitled "implated Assymetric Doped Polysilicon Gate FinFET."

BACKGROUND OF THE INVENTION

The present invention relates generally to the field of semiconductor manufacturing and, more specifically, to a method for forming double gated field effect transistors.

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in CMOS technologies, such as the in the design and fabrication of field effect transistors (FETs). FETs are used in almost all types of integrated circuit design (i.e., microprocessors, memory, etc.) Unfortunately, increased device density in CMOS FET can result in degradation of performance and/or reliability.

One type of FET that has been proposed to facilitate increased device density is a double gated field effect transistor. Double gated FETs use two gates, one on each side of the body, to facilitate scaling of CMOS dimensions while maintaining an acceptable performance. In particular, the use of the double gate increases the gate area, which allows the transistor to have better current control, without increasing the gate length of the device. As such, the double gated FET is able to have the current control of a larger transistor without requiring the device space of the larger transistor.

Unfortunately, several difficulties arise in the design and fabrication of double gated CMOS transistors. First, the relative dimensions of a double gated transistor are such that it is difficult to reliably fabricate one that has a reliable performance and minimum feature size. Second, the threshold voltage of a double gated transistor is highly dependent upon the material used for the two gates. In particular, current fabrication techniques have generally resulted in a double gated transistor that has either too high a threshold voltage, or too low of a threshold voltage. For example, if the gates are doped the same polarity as the source, the threshold voltage will generally be near or below zero. Conversely, if the gates are doped the opposite polarity of the source, then the threshold voltage will be approximately one volt. Neither result is desirable in most CMOS applications.

Thus, there is a need for improved device structures and methods of fabrications of double gated CMOS devices that provide improved threshold voltage of the resulting double gated CMOS without overly increasing fabrication complexity.

BRIEF SUMMARY OF THE INVENTION

In a first aspect, the invention is a method for forming a transistor, the method comprising the steps of:
a) forming a transistor body on a substrate, the transistor body having a first vertical edge and a second vertical edge, and a first end and a second end;
b) implanting a source at the first end of the transistor body, and implanting a drain at the second end of the transistor body;
c) forming a first gate structure adjacent the transistor body first vertical edge, the first gate structure having a first workfunction, and wherein the first gate structure overlaps the source and the drain; and
d) forming a second gate structure adjacent the transistor body second vertical edge, the second gate structure having a second workfunction different from the first workfunction, and wherein the second gate structure does not overlap the source or the drain.

The foregoing and other advantages and features of the invention will be apparent from the following more particular description of a preferred embodiment of the invention, as illustrated in the accompanying drawings.

In a second aspect, the invention is a transistor comprising:
a) a transistor body formed on a substrate, the transistor body having a first vertical edge and a second vertical edge, and a first end and a second end;
b) a source formed at the first end of the transistor body, and a drain formed at the second end of the transistor body;
c) a first gate structure adjacent the transistor body first vertical edge, the first gate structure having a first workfunction, and wherein the first gate structure overlaps the source and the drain; and
d) a second gate structure adjacent the transistor body second vertical edge, the second gate structure having a second workfunction different from the first workfunction, and wherein the second gate structure does not overlap the source or the drain.

BRIEF DESCRIPTION OF THE SEVERAL VIEWS OF THE DRAWINGS

The preferred exemplary embodiment of the present invention will hereinafter be in conjunction with the appended drawings, where like designations denote like elements.

FIGS. 3–23 are top and cross-sectional side views of an exemplary double gate transistor having a weak gate spacer during fabrication.

DETAILED DESCRIPTION OF THE INVENTION

Accordingly, the present invention provides a double gated transistor and a method for forming the same that results in improved device performance and density. The preferred embodiment of the present invention provides a double gated transistor with asymmetric gate doping, where one of the double gates is doped degenerately n-type and the other degenerately p-type. By doping one of the gates n-type, and the other p-type, the threshold voltage of the resulting device is improved. In particular, by asymmetrically doping the two gates, the resulting transistor can, with adequate doping of the body, have a threshold voltage in a range that enables low-voltage CMOS operation. For example, a transistor can be created that has a threshold voltage between 0V and 0.5V for nFETs and between 0 and −0.5V for pFETs.

Additionally, the preferred transistor design uses an asymmetric structure that results in reduced gate-to-drain and gate-to-source capacitance. In particular, dimensions of the weak gate, the gate that has a workfunction less attractive to the channel carriers, are reduced such that the weak gate does not overlap the source/drain regions of the transistor. In contrast the strong gate, the gate having a workfunction that causes the inversion layer to form adjacent to it, is formed to slightly overlap the source/drain regions. This asymmetric structure allows for the performance benefits of a double gate design without the increased capacitance that would normally result.

Various electrically conducting materials have associated with them a built-in electrical potential, often referred to as a work-function, which, along with externally applied voltage, determines the relative affinity of the conductor for electrons (or holes). In a metal, the fermi level is intrinsic to the material, while in a semiconductor, such as silicon, this fermi level can be adjusted to values between the valence band and conduction band by introduction of impurities which supply excess holes or electrons. In the asymmetric double gated FET of the preferred embodiment, the two gate electrodes are doped with opposite polarity, with one gate being doped n-type and the other gate being doped p-type. Thus, the two gate electrodes have different fermi levels and hence one gate electrode (the strong gate, the n-gate for nFETs) has a greater affinity for the inversion carriers while the other electrode (the weak gate, the p-gate for nFETs) has a lesser affinity for the inversion carriers. As a result the inversion channel will form in the semiconductor body at a location nearer the 'strong' gate, and thus results in both gate electrodes contributing to the inversion potential leading to a relatively low threshold voltage (e.g, between 0 and 0.5 volts).

Figure 1:
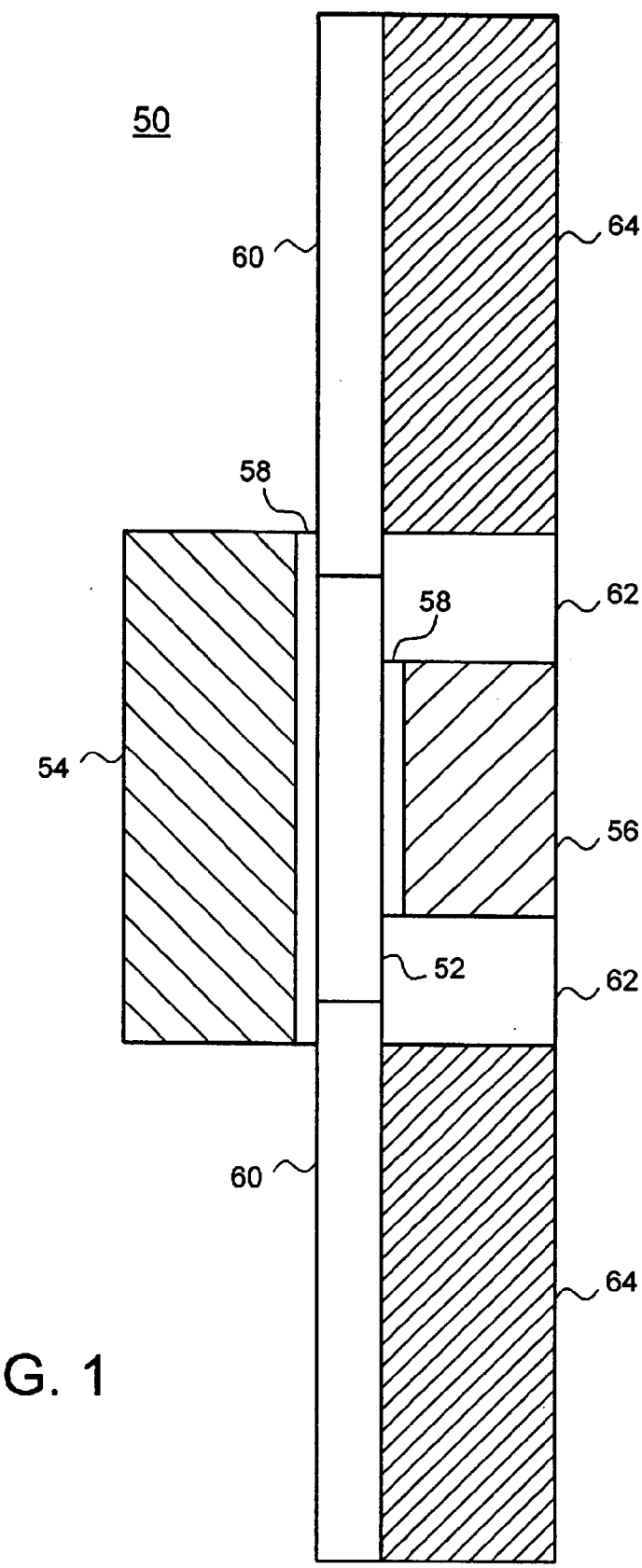
FIG. 1 is a top schematic view of a double gate transistor having a weak gate spacer.

Turning now to FIG. 1, a top sectional view of an asymmetric double gate transistor 50 is shown. The asymmetric double gate transistor 50 includes a body 52, a strong gate 54, a weak gate 56, a gate dielectric 58 between the strong gate 54 and the body 52 and between the weak gate 56 and the body 52, source/drains 60, weak gate spacers 62 and source/drain contacts 64. The asymmetric double gate transistor 50 is a fin transistor, meaning that the transistor body is formed from a thin piece of semiconductor and thus has the typical "fin" shape. In a fin type structure, the double gates are formed on each side of the body, with the body being disposed between the gates.

The asymmetric double gate transistor 50 is formed such that a first gate has a first workfunction (and hence a first fermi level) and a second gate has a second workfunction (ane hence a second fermi level). Because the gates have different workfunctions, one gate will have a work-function that is more attractive to the channel carriers in the body. In this application, the gate that is more attractive to channel carriers is called the "strong" gate. The other gate will have a workfunction that is less attractive to the channel carriers, and will be called the "weak" gate. During operation, the workfunction difference causes the inversion layer in the body to form adjacent to the strong gate, but not adjacent to the weak gate. The strong gate thus provides the majority of the control over the operation of the transistor.

In the case of an NFET made with one p-type gate and one n-type gate, the n-type gate will be the strong gate, and the p-type gate will be the weak gate. Conversely, in the case of the PFET made with one p-type gate and one n-type gate, the p-type gate will be the strong gate, and the n-type gate will be the weak gate. Thus, in FIG. 1 both the strong gate 54 and the weak gate 56 could be either p-type or n-type materials.

In transistor 50, the dimensions of the weak gate 56 are reduced when compared to the dimensions of the strong gate 54. This asymmetry of dimensions of the strong and weak gates allows for increased control of the transistor without excessive increases capacitance that normally arise in asymmetric double gate transistors. In particular, the strong gate 54 is formed to overlap both source/drains 60. Having the strong gate 54 overlap both source/drains provides for good threshold voltage control and prevents anomalous hot-electron degradation, high series resistance, and poor threshold control. The weak gate 56, in contrast, is formed with reduced dimensions such that the weak gate 56 does not overlap the source/drains 60. Because the strong gate 54 provides the majority of the control over the carriers in the body, this shortening of the gate does not excessively lower the performance of the transistor. However, the shortening of the weak gate 56 does significantly lesson the source-to-gate and drain-to-gate capacitance caused by the weak gate. Thus, the asymmetric double gated transistor 50 gets the improved control of a double gated transistor without the excessive capacitance that would normally result.

Since in normal operation of an asymmetric double gate transistor the weak gate is spaced from the inversion channel by the thickness of the body of the transistor, the source and drain electric fields will shield the electrical effects of this gate from the inversion channel nearby (within a body thickness of) the source and drain regions. Thus the weak gate has negligible effect on the operation of the device at the inversion channel immediately adjacent to the source and drain, the weak gate provides gating of the channel and allows threshold voltage of useful values (typically 0.1 to 0.4 V for nFETs and −0.1 to −0.04 for pFETs) to be attained. It also provides the role of inhibiting punch-through or other deleterious short channel effects.

In transistor 50, weak gate spacers 62 are formed to separate the weak gate 56 from the source/drains 60 and the source/drain contacts 64. These spacers can be formed from any suitable dielectric material. Preferably the weak gate spacers 62 have a dimension selected to separate the weak gate 56 from the source/drains 60 sufficient to significantly reduce the source-to-gate and drain-to gate capacitance while not so large as to introduce large resistance in the source/drain regions 60 when the current spans from the body to the contacts 64. Typically, it will be desirable to make the weak gate spacer of a dimension between one to three times the thickness of the body. It is generally desirable that the dimension of the spacers 62 be such that the length of underlap—i.e., the distance between the edge of the weak gate 56 and the start of the source/drains 60 â∈" be approximately equal to the thickness of the body 60. This provides good control of the inversion channel from the weak gate while minimizing capacitance from the weak gate to the source and drain.

The transistor 50 also provides good conductance between the source/drains 60, the source/drain contacts 64 and the body 52. The low resistance of the contact provides for higher drain current from the FET and hence higher speed. In particular, the source/drain contacts 64 are made very close to the source/drains 60 and the body 52, improving the conductivity of the transistor. However, because of spacers 62, the source/drain contacts 64 add little capacitance to the weak gate 56. Furthermore, because the source/drain contacts 64 are formed only on the side of the source/drains 60 that is opposite the strong gate 54, the source/drain contacts 64 are relatively far away from strong gate 56. The greater distance between the source/drain contacts 64 and the weak gate 56 and the strong gate 54 lessens the capacitance between the contacts and the gates. Thus, transistor 50 has the benefit of good conductance between source/drain contacts 64 while maintaining low capacitance between those contacts and the gates.

Figure 2:
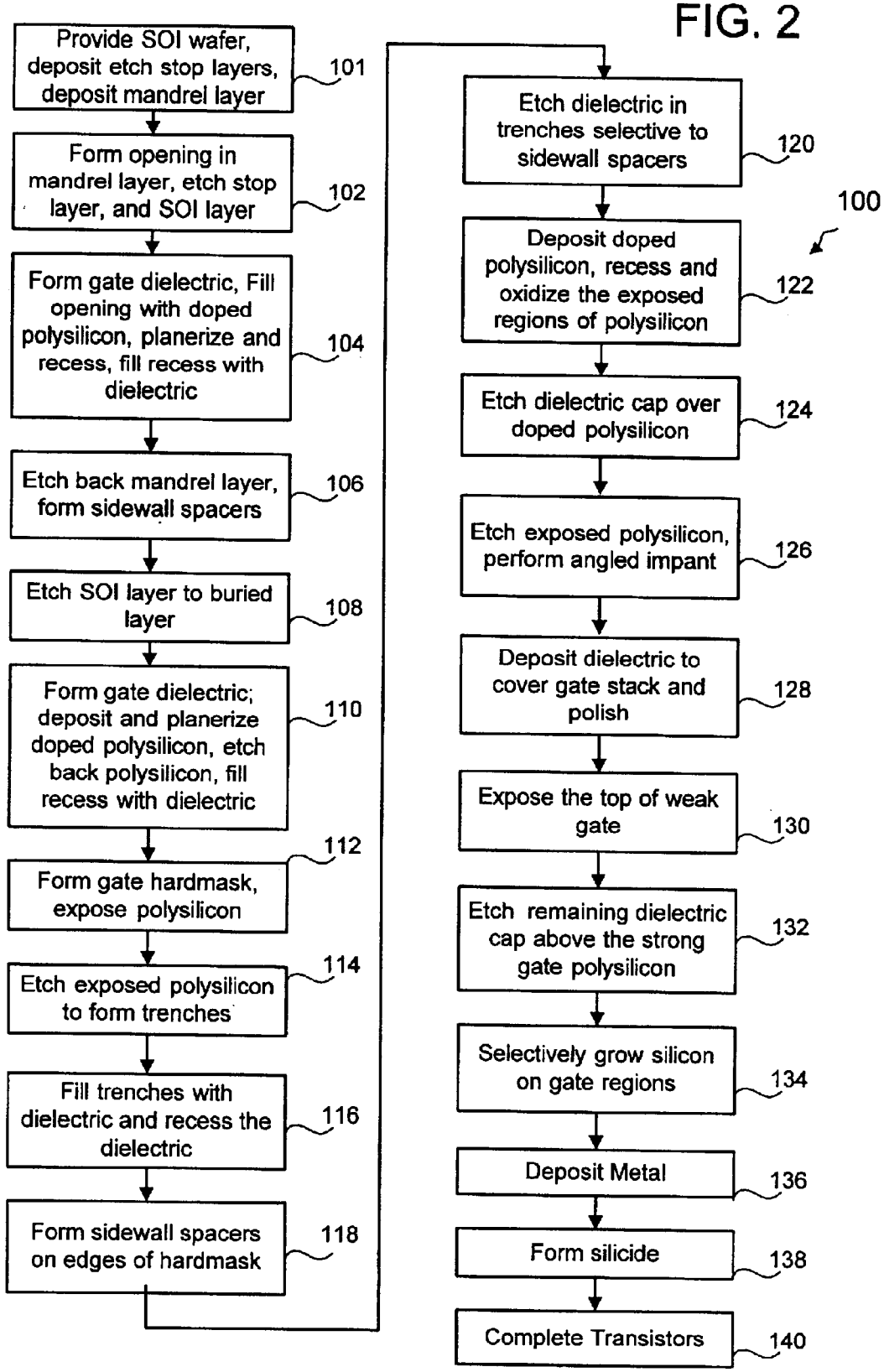
FIG. 2 is a flow diagram illustrating a fabrication method.

Turning now to FIG. 2, a method 100 for forming an asymmetric double gated transistor in accordance with the preferred embodiment is illustrated. Method 100 forms an asymmetric double gated transistor having a weak gate with reduced dimensions compared to the strong gate. Spacers are formed between the weak gate and the source/drain contacts, thus reducing source-to-gate and drain-to-gate capacitance.

Method 100 is best suited for the formation of double gate transistors in pairs. The formation of exemplary transistors using method 100 will be illustrated in FIGS. 3–23. Specifically, FIGS. 3–23 illustrate the formation of two of the transistors 50 illustrated in FIG. 1. Each of these transistors includes weak gate spacers to separate the weak gate from the source/drain regions of the transistor. Of course, those skilled in the art will recognize that the principles of the present invention can easily be applied to the formation of single transistors.

The first step 101 of method 100 is to provide an appropriate wafer, form an etch stop layer and deposit a mandrel layer. In the preferred embodiment, the wafer used comprises a silicon on insulator (SOI) wafer. As such, the wafer comprises a buried oxide layer beneath an SOI layer. As will be come clear, the SOI layer is used to form the body of the double gated transistor. As such, it is generally preferable to use a SOI layer that has a p-type (for NFETs) doping density in the range of $1 \times 10^{18}$ cm$^{31\ 3}$ to $8 \times 10^{18}$ cm$^{31\ 3}$ to provide proper centering and control of the threshold voltage of the transistor. However, in another embodiment to be described later, the doping of the SOI layer is done with an angled implant to facilitate the achievement of a uniform concentration density throughout the body.

However, non-SOI wafers can be used. When a non-SOI wafer is used, the processing remains otherwise identical to those of the SOI wafer case, except as noted.

With a SOI wafer provided, an etch stop layer is formed on the wafer, preferably comprising a silicon dioxide layer. The etch stop layer preferably has a thickness of 10 to 50 nm. The etch stop layers will be used throughout the fabrication process when an appropriate etch stop is needed.

Next, a mandrel layer is formed. The mandrel layer preferably comprises a layer of silicon nitride or other suitable material. In the preferred embodiment, the mandrel layer comprises silicon nitride and has a thickness of between 40 nm and 100 nm, however, such a thickness may change depending on the desired body thickness.

Figure 3C:
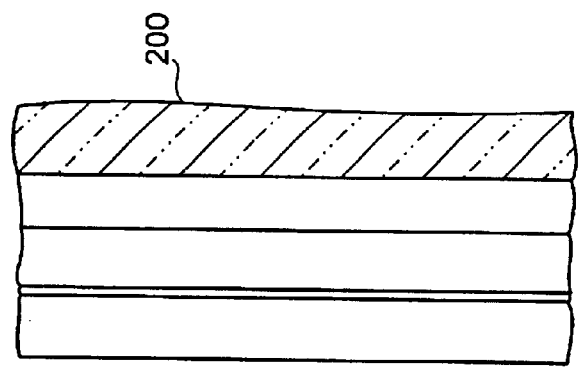
Figure 3A:
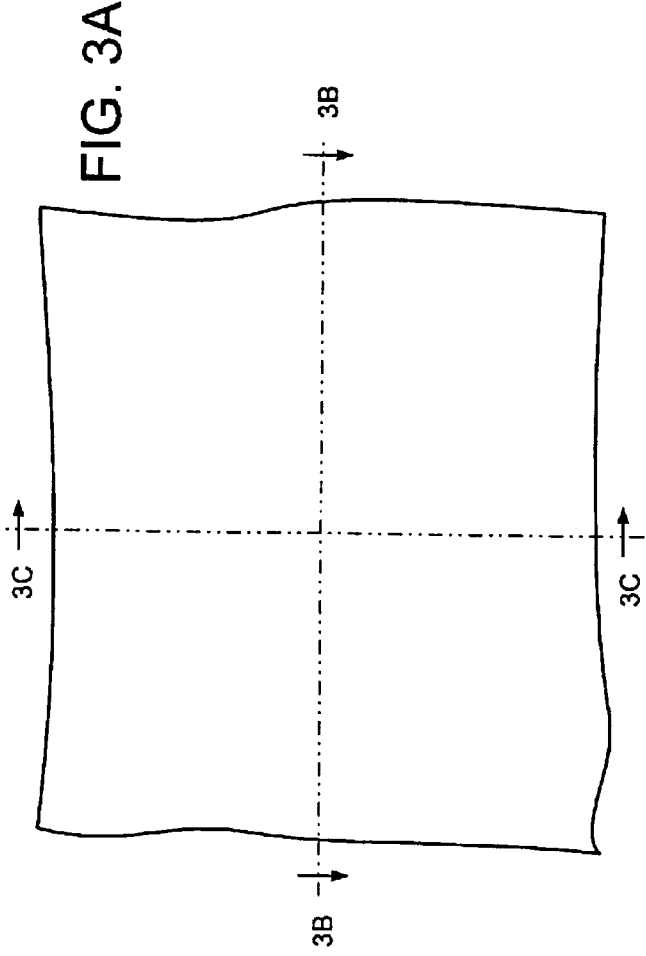
Figure 3B:
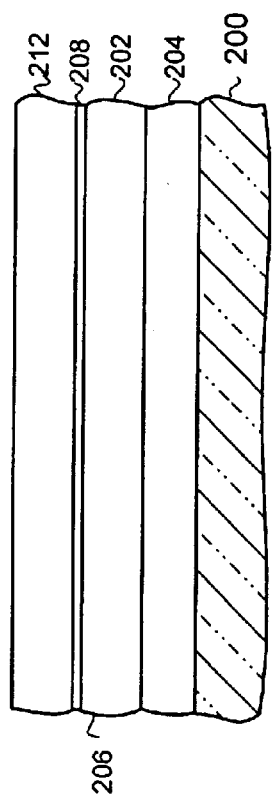

Turning now to FIGS. 3A, 3B, and 3C, a wafer portion 200 is illustrated after the formation of etch stop layers and a mandrel layer. FIG. 3A illustrates a top view of the wafer portion 200, and FIGS. 3B and 3C illustrate cross-sectional side views taken at lines 3B and 3C respectively. The preferred embodiment wafer portion 200 comprises an SOI wafer, and as such includes an SOI layer 202 and a buried oxide layer 204. On top of the SOI layer 202 is formed a oxide layer 208, which will serve as an etch stop layer. On top of oxide layer 208 is formed a mandrel layer 212. The mandrel layer 212 preferably comprises silicon nitride, but could also comprise other suitable materials.

Returning to FIG. 2, the next step 102 is to form an opening in the mandrel layer, etch stop layer and SOI layer. This patterning can be accomplished using any suitable photolithographic and etch process. The opening defines the regions in which the asymmetric double gate transistor will be formed.

Figure 4C:
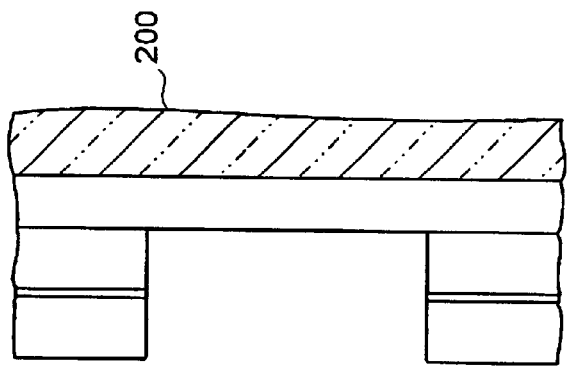
Figure 4A:
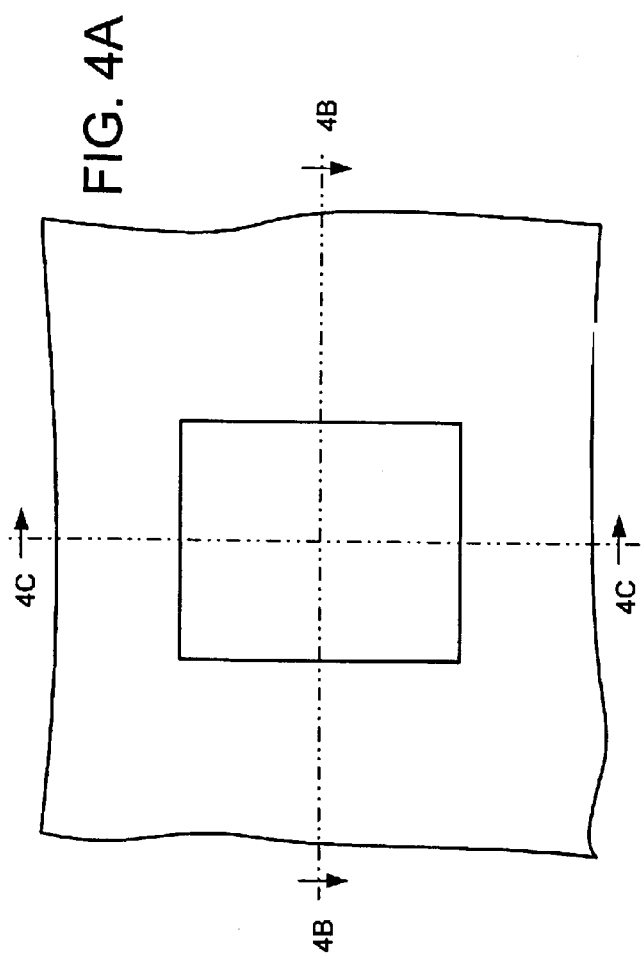
Figure 4B:
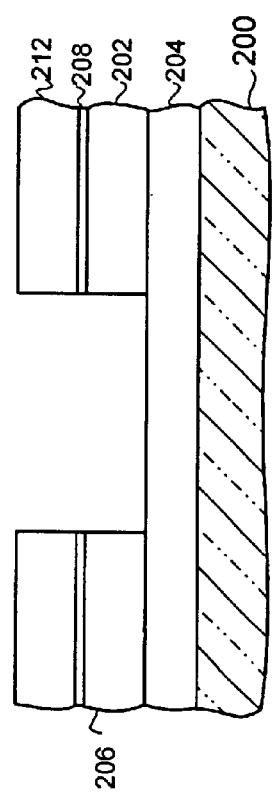

Turning to FIGS. 4A, 4B and 4C, the wafer portion 200 is illustrated after the mandrel layer 212, oxide layer 208 and SOI layer 202 has been patterned to form an opening in these layers.

Returning to FIG. 2, the next step 104 is to provide gate dielectric on the exposed surfaces of the silicon by either thermal oxidation of the exposed silicon or deposition of silicon dioxide or high k dielectric. Next, the opening is filled with doped polysilicon, planarize and recessed, and then the recess filled with a dielectric to form a dielectric cap on the doped polysilicon. As will become clear, this doped polysilicon will be used to form the weak gate of the asymmetric double gate transistor. Thus, in a NFET, this will comprise p+ doped polysilicon, while in a PFET it will comprise n+ doped polysilicon. The recessing is preferably done to between 30 and 80 nm the top of the mandrel layer. The filling of the recess can be done by depositing the dielectric or by growing of the dielectric. The dielectric cap preferably comprises silicon dioxide, but it could also other comprise suitable dielectric materials.

Turning now to FIGS. 5A, 5B and 5C, the wafer portion 200 is illustrated after the deposition, planarization and recessing of doped polysilicon 214, and the deposition and planarization of a dielectric cap 216. Again, the doped polysilicon 214 can comprise either p+ and n+ type polysilicon, depending on whether the transistor being formed in an NFET or a PFET. The dielectric cap 216 preferably comprises silicon dioxide, but it can also comprise other suitable dielectric materials.

Returning to FIG. 2, the next step 106 is to etch back the mandrel layer, and form sidewall spacers on the dielectric cap and the exposed portions of the doped polysilicon. The removal of the mandrel layer can be done using any suitable etch with the etch stop layer used as an etch stop. The sidewall spacers will be used as part of a sidewall image transfer which is used to define the body of the double gated transistor. The sidewall spacer is preferably formed using a deposition of silicon nitride, followed by a suitable directional etch. As will be shown later, the thickness of sidewall spacer will define the body region of the asymmetric double gated transistor using sidewall image transfer. This allows the gate length of the device to have minimum feature size, while allowing the thickness of the body to be much smaller than the gate length. This improves control of the threshold voltage of the resulting device.

Figure 6A:
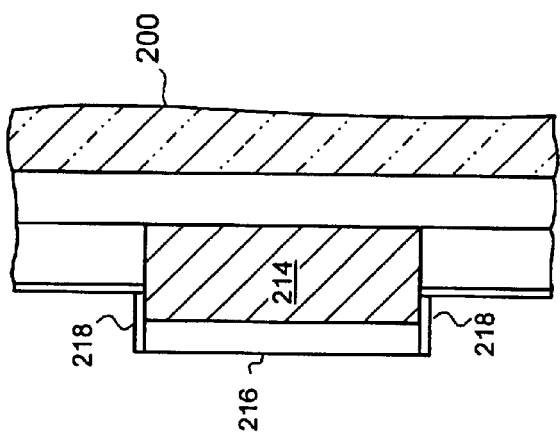
Figure 6B:
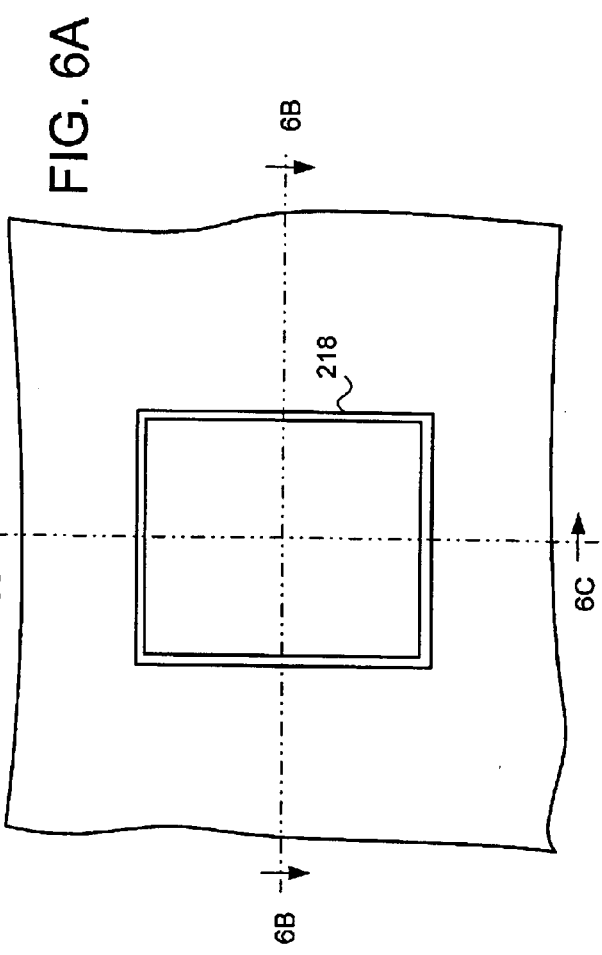
Figure 6C:
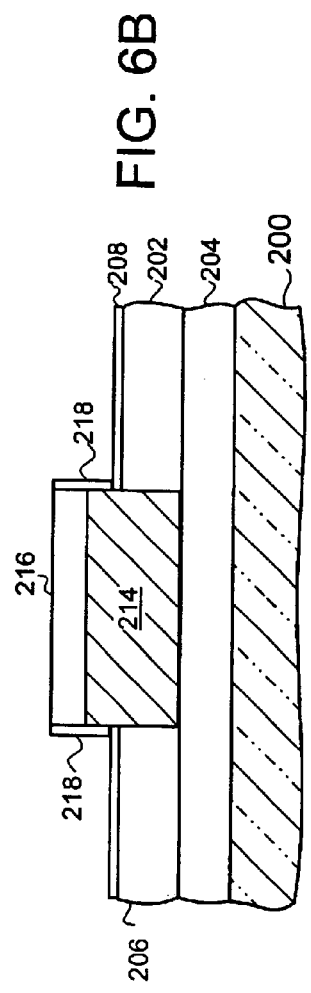

Turning now to FIGS. 6A, 6B and 6C, the wafer portion 200 is illustrated after the removal of the mandrel layer 212, and the formation of sidewall spacers 218 on the sidewalls of the dielectric cap 216 and the exposed portion of doped polysilicon 214. The mandrel layer 212 was removed using a selective etch, and oxide layer 204 was used as an etch stop. Again sidewall spacers 21 8 will be used to define the fin body structure of the transistor.

Returning to FIG. 2, the next step 108 is to etch the SOI layer to buried dielectric layer. This etch process is preferably anisotropic and done selective to the sidewall spacers and dielectric cap. This etch process defines the remaining portions of the SOI layer as the fin body of the transistors.

Figure 7C:
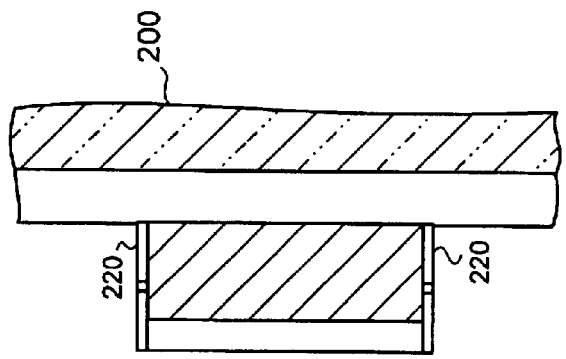
Figure 7A:
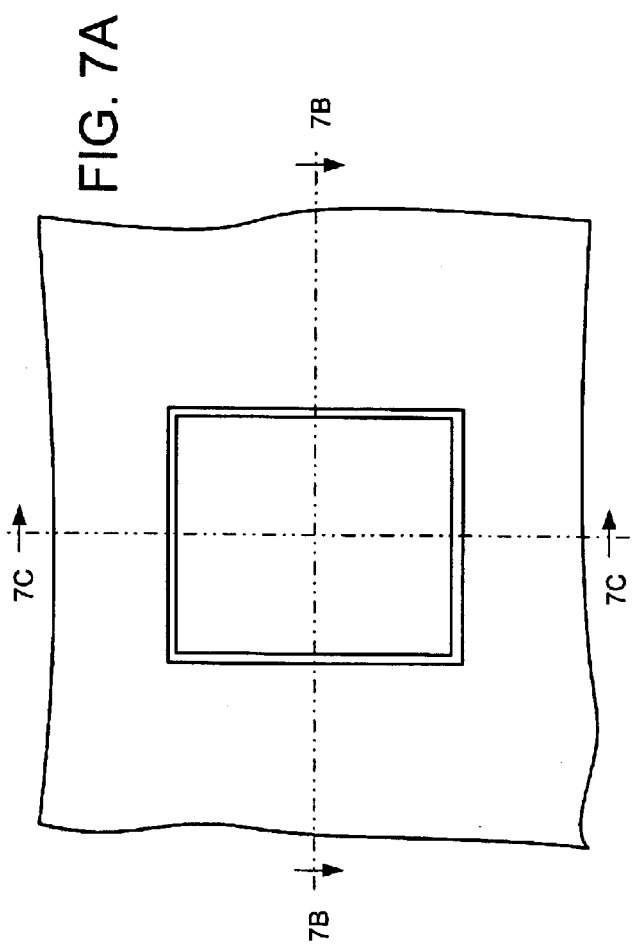
Figure 7B:
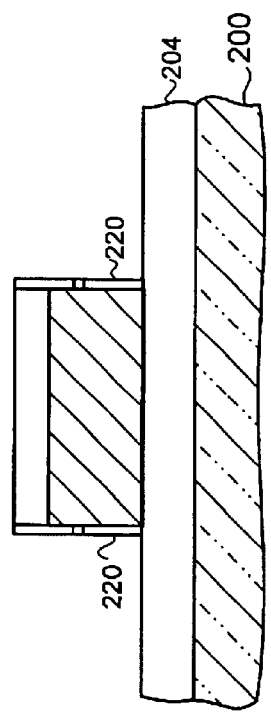

Turning now to FIGS. 7A, 7B and 7C, the wafer portion 200 is illustrated after the SOI layer 202 has been anisotropically etched. The remaining portions of the SOI layer 202 will be used to form the fin bodies of the asymmetric double gate transistors. In wafer portion 200, two SOI fins 220 have been defined from the SOI layer 202, and will be used to form the bodies and the source/drains of two double gate transistors.

Returning to FIG. 2, the next step 110 is to form the gate dielectric, deposit and planarize doped polysilicon, etch back the doped polysilicon, and fill the recess with dielectric. The gate dielectric is preferably a gate oxide, formed by thermal oxidation, typically at 750–800 Å° C.

Also, during this step an implantation into the body of the transistor can be done. This would preferably comprise an angled implant into the exposed sidewall of the SOI layer, done before the formation of the gate oxide. This would serve to properly dope the body of the transistor.

The doped polysilicon formed in this step will be used to will be used to form the strong gates of the asymmetric double gate transistor. Thus, in the NFET case, the doped polysilicon will comprise n+ doped polysilicon, and in the PFET case, the doped polysilicon will comprise p+ doped polysilicon. The dielectric cap deposited after recessing preferably comprises a silicon nitride cap, but it could also comprise other suitable materials.

Figure 8C:
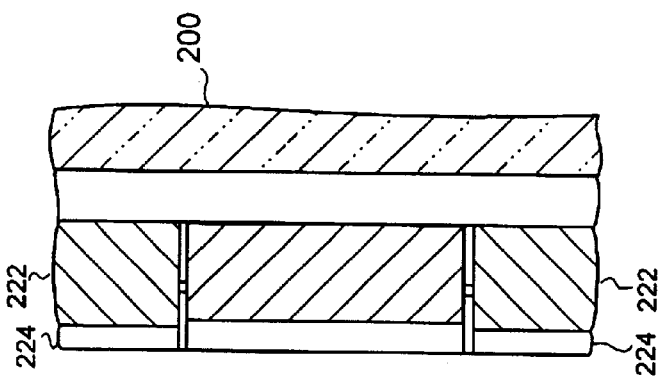
Figure 8A:
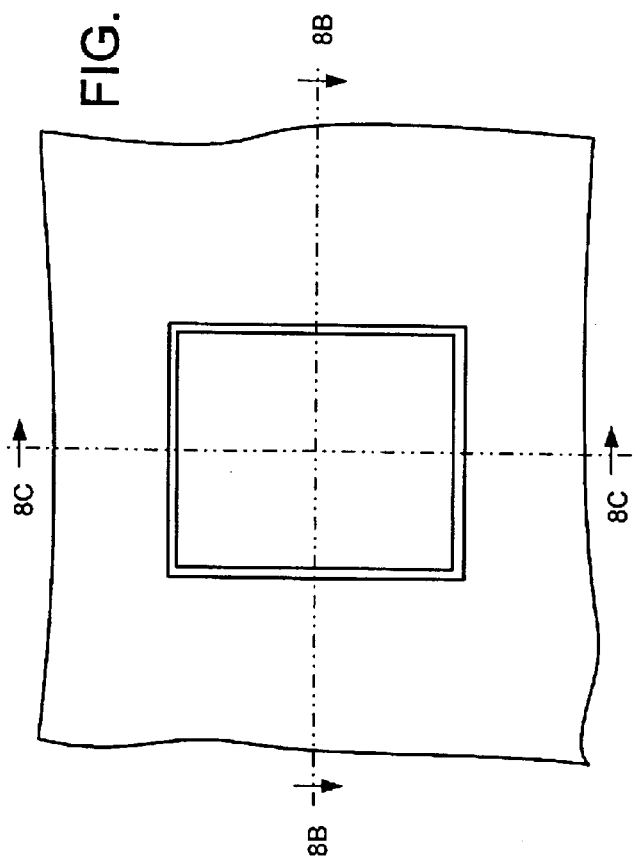
Figure 8B:
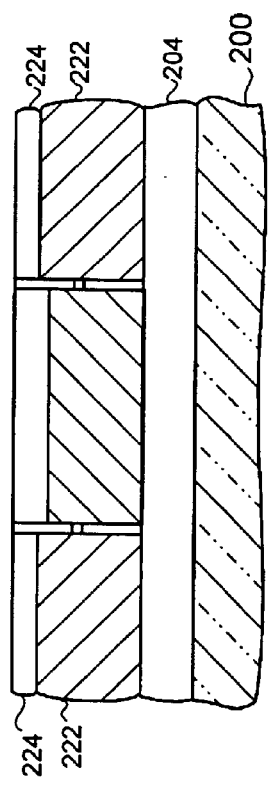

Turning now to FIGS. 8A, 8B and 8C, the wafer portion 200 is illustrated after gate oxide has been formed on the side of the SOI fins 220, and doped polysilicon 222 has been deposited, planarized and recessed, and dielectric caps 224 have been formed on the doped polysilicon 222. Again, an angled body implant can also be performed before the formation of the gate oxide.

Returning to FIG. 2, the next step 112 is to form a gate photo hardmask and selectively expose a portion of the doped polysilicon using the hardmask This is preferably done by depositing an oxide layer and the nitride layer, and then patterning the oxide and nitride layers to form a hardmask. The nitride is then etched selective to the oxide. Next, the oxide of the dielectric cap is etched selective to the nitride, exposing a portion of the underlying doped polysilicon. As will become clear, the exposed portions of the doped polysilicon will etched away selectively and subsequently filled with silicon dioxide.

Turning now to FIGS. 9A, 9B and 9C, the wafer portion 200 is illustrated after the deposition and patterning of oxide 230 and nitride 232 to form a photo hardmask, and the use of the hardmask to selectively expose a portion of doped polysilicon 214.

Returning to FIG. 2, the next step 114 is etch the exposed doped polysilicon. This etch is done selectively with respect to the nitride portion of the hardmask deposited in the last step. The remaining portion of the doped polysilicon will be used to form the weak gates of the transistors. As will become clear, the source/drain contacts and weak gate spacers will later be formed in these openings.

Figure 10C:
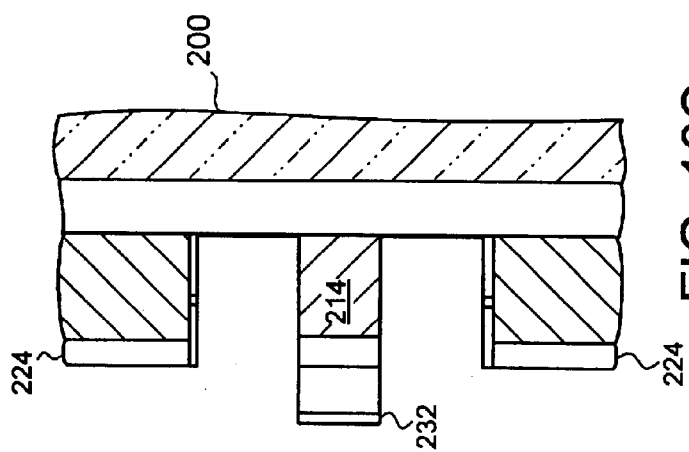
Figure 10A:
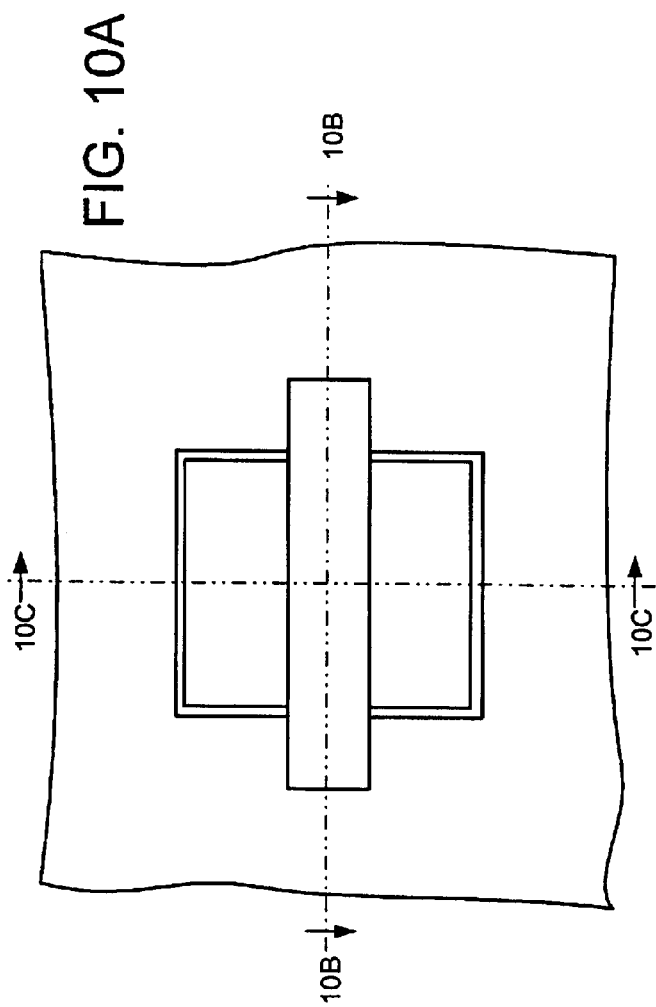
Figure 10B:
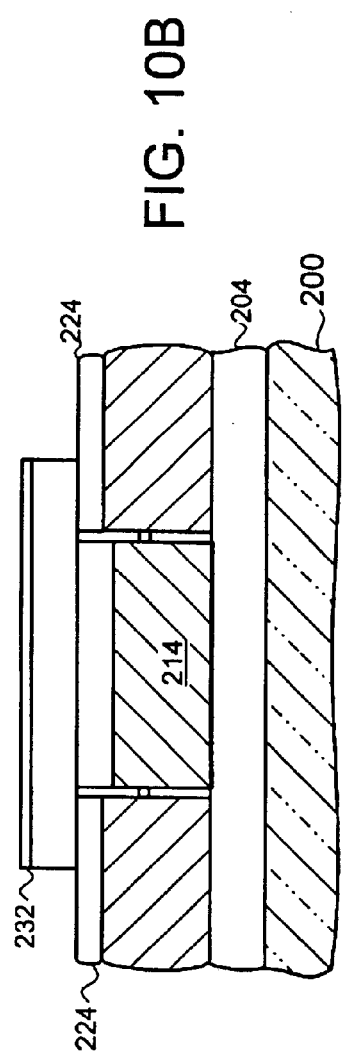

Turning now to FIGS. 10A, 10B and 10C, the wafer portion 200 is illustrated after doped polysilicon 214 has been etched selectively with respect to the nitride 232 and nitride 224. This forms a trench on each side of the remaining polysilicon 214. The remaining portion of doped polysilicon 214 will be used to form the two weak gates needed for the two asymmetric double gate transistors illustrated in wafer portion 200.

Returning to FIG. 2, the next step 116 is fill the trenches with dielectric and recess the dielectric to below the top of the nitride over the strong gate polysilicon. Preferably, this is done by depositing an oxide, planarizing and then using an etch to etch back to a level just below the top of the nitride over the strong gate polysilicon.

Turning now to FIGS. 11A, 11B and 11C, the wafer portion 200 is illustrated after oxide 236 has been deposited and etched back to just below the top surface of nitride 224.

Returning to FIG. 2, the next step 118 is to form sidewall spacers on the edges of the gate hardmask. These sidewall spacers will be used to define the weak gate spacers that separate the weak gate from the source and drains on the transistor. These sidewall spacers can be formed using any suitable technique, such as by conformal deposition and directional etch of a nitride layer. The sidewall spacer is preferably made thin, between 1 and 10 nm, such that the loss of the nitride over the n+ doped polysilicon is minimal.

Turning now to FIGS. 12A, 12B and 12C, the wafer portion 200 is illustrated after sidewall spacers 238 have been formed adjacent to the gate hardmask that comprises oxide 230 and nitride 232. Again, sidewall spacers 238 are preferably made thin such that there is minimal loss to nitride 224.

Returning to FIG. 2, the next step 120 is etch the dielectric in the trenches. This is preferably done using anisotropic etch selective to the sidewall spacer on the sides of the hardmask and selective to the dielectric cap on the doped polysilicon. This etch process defines weak gate spacers 240 where the dielectric material remains. The weak gate spacers 240 separate the weak gate, comprising polysilicon 214, from the source and drain contacts to be deposited later.

Figure 13A:
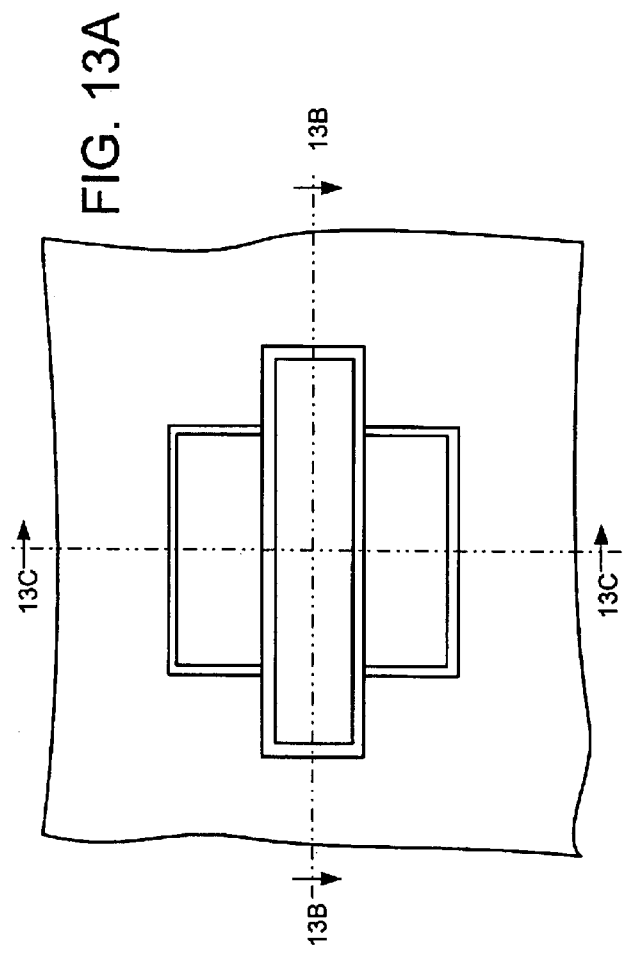
Figure 13B:
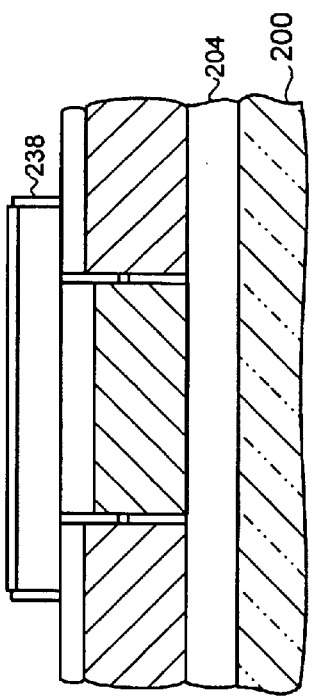
Figure 13C:
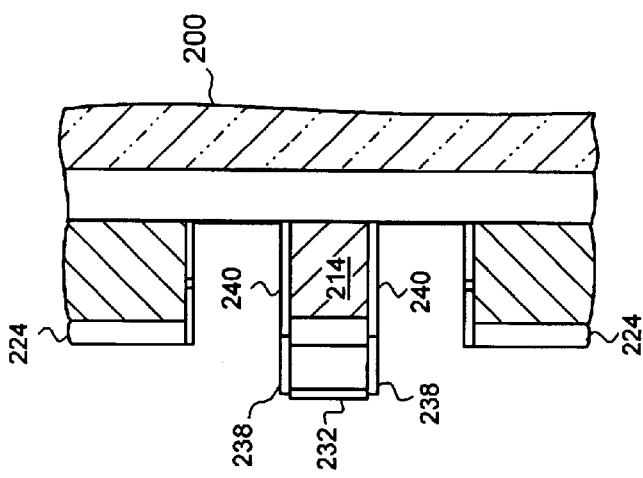

Turning now to FIGS. 13A, 13B and 13C, the wafer portion 200 is illustrated after the oxide 236 has been anisotropically etched away selective to nitride sidewall spacers 238 and nitride cap 224. The etch process leaves oxide at the edge of the polysilicon 214. The remaining oxide forms weak gate spacers 240 that will separate the weak gate (that comprises polysilicon 214) from the source/drain contacts to be formed later.

Returning to FIG. 2, the next step 122 is to deposit doped polysilicon, recess and oxidize the exposed regions of polysilicon. This is preferably accomplished by first performing a clean up of the wafer, using a wet etch such as dilute HF. Doped polysilicon is then deposited into the openings formed in the previous steps. This doped polysilicon will be used to form the source/drain contacts for the transistors, and thus will preferably comprise n+ doped polysilicon for NFETs and p+ doped polysilicon for PFETs. The doped polysilicon is then planarized and etched back to recess the top surface of the polysilicon. The recess is preferably done until the sidewall spacers are fully exposed. The deposited polysilicon is then oxidized to form a silicon dioxide cap over the top.

Turning now to FIGS. 14A, 14B and 14C, the wafer portion 200 is illustrated after doped polysilicon 242 has been deposited, planarized and recessed. Silicon dioxide 244 has been grown over the doped polysilicon 242. The doped polysilicon 242 is used to form low resistance contacts for the source and drains of the transistors. Thus, they are formed directly adjacent to the source/drain regions of the transistor body fin.

Returning to FIG. 2, the next step 124 is to perform an anisotropic etch of dielectric cap over the doped polysilicon. This etch also removes the cap over the gate portion of the doped polysilicon. Finally, this etch removes a portion of the sidewall spacers on the edges of the hardmask. However, because the sidewall spacers are taller than the nitride is thick over the doped polysilicon, a portion of the sidewall spacers remains.

Figure 15C:
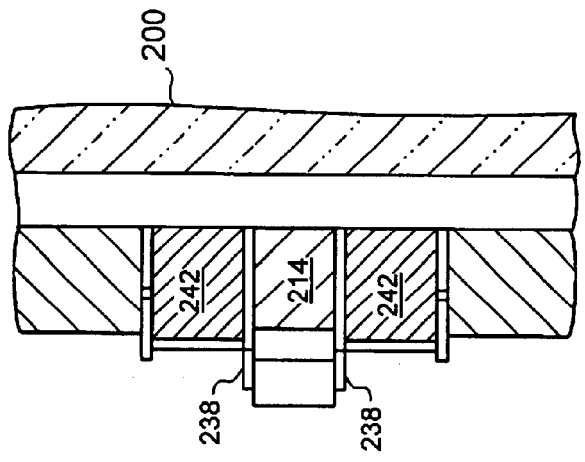
Figure 15A:
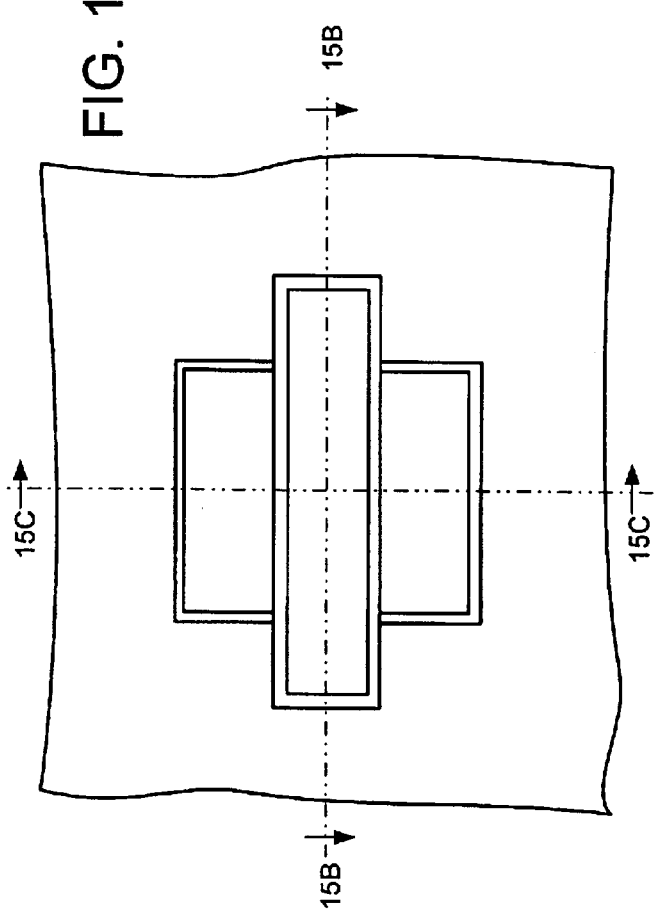
Figure 15B:
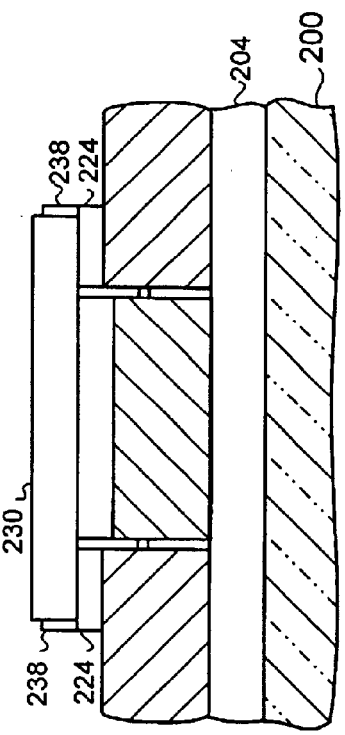

Turning now to FIGS. 15A, 15B and 15C, the wafer portion 200 is illustrated after an anisotropic etch of silicon nitride. The anisotropic etch removed the silicon nitride portion 232 of the gate hardmask. The etch also removed a portion of the nitride cap 224, although the portion under the hardmask remains. The sidewall spacers 238 are also partially removed by the etch process.

Returning to FIG. 2, the next step 126 is to etch the exposed polysilicon and perform an angled implant. The angled implant forms the source and drain regions of the FET in a portion of the fin body. The etch process completes the formation of the strong gate in the asymmetric double gated transistor. The etch is preferably an etch which is selective to oxide.

The angled implants preferably comprise arsenic for n-type FETs or boron difluoride for p-type FETs, tilted between 45 degrees and 75 degrees from a ray normal to the plane of the wafer, and oriented at angles in the plane of the wafer between 45 degrees and 90 degrees with respect to the fins. The doses and energies of the these implants preferably range from between $2 \times 1014$ to $1 \times 1015$ cm$-2$ at 1 to 15 keV.

Turning now to FIGS. 16A, 16B, 16C and 16D the wafer portion 200 is illustrated after an etch of doped polysilicon 222 to complete the formation of the strong gates 250. FIG. 16B shows the formation of two strong gates 250, with each strong gate being for one of the two double gate transistors being formed on the wafer portion 200. This etch step is preferably selective to the oxide protecting other portions of doped polysilicon.

FIGS. 16A and 16D illustrate the direction of the angled implants used to form the source and drains with vectors 231. Vectors 231 show that the angled implants are made between 45 degrees and 75 degrees from a ray normal to the plane of the wafer, and oriented at angles in the plane of the wafer between 45 degrees and 90 degrees with respect to the fins. Performing the angled implants as such results in source and drain regions that are self aligned to the strong gate edges, thus ensuring positive overlap of the strong gate over the source and drains.

Returning to FIG. 2, the next step 128 is deposit a dielectric film and polish the dielectric film to the top of the gate caps. The dielectric film is preferably silicon nitride, and thus different than the previously deposited gate hardmask. The dielectric film is preferably deposited with a thickness greater than the gate stack height. The polishing of the dielectric removes the top surface to expose the silicon dioxide at the top of the gate stack.

Turning now to FIGS. 17A, 17B and 17C, the wafer portion 200 is illustrated after deposition and polishing of the a dielectric 252. Again, the dielectric preferably comprises a material different than the previously deposited gate hardmask 230. Most preferably, the dielectric comprises silicon nitride, which is then polished back to expose the silicon dioxide gate hardmask 230.

Returning to FIG. 2, the next step 130 is to etch exposed portions of the gate hardmask to expose the top of the weak gate polysilicon.

Turning now to FIGS. 18A, 18B and 18C, the wafer portion 200 is illustrated after the gate hardmask 230 has been selectively etched to expose the weak gate polysilicon 214.

Figure 19A:
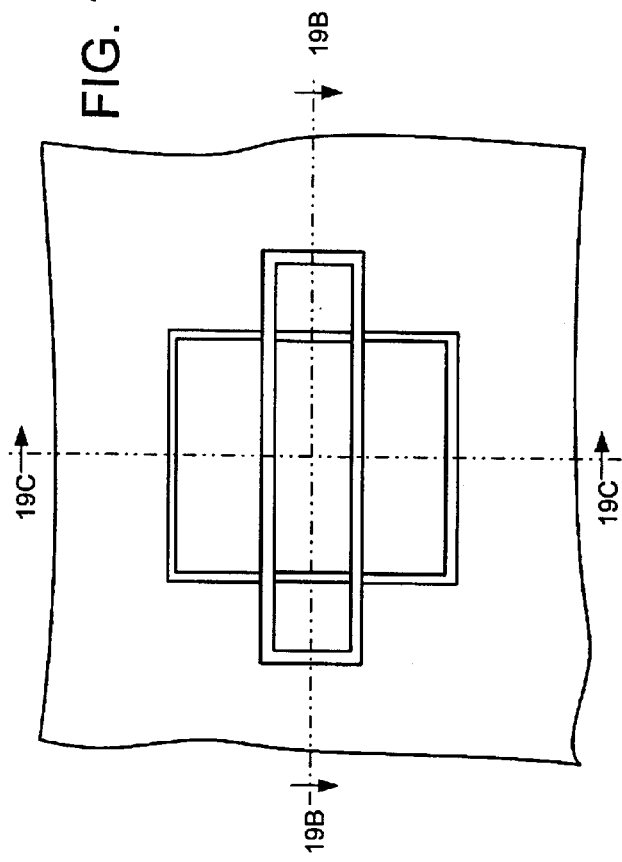
Figure 19B:
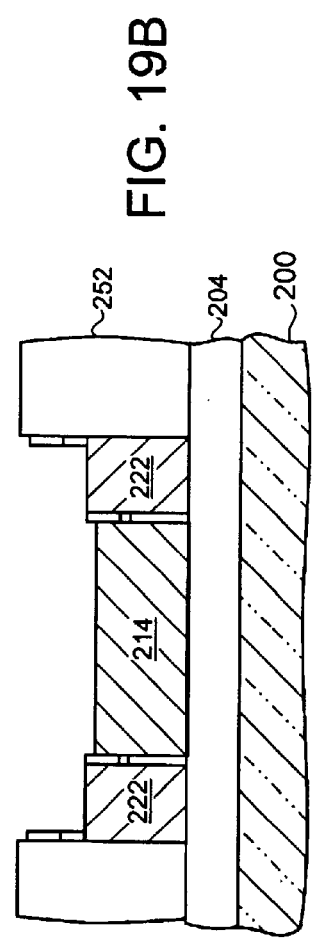
Figure 19C:
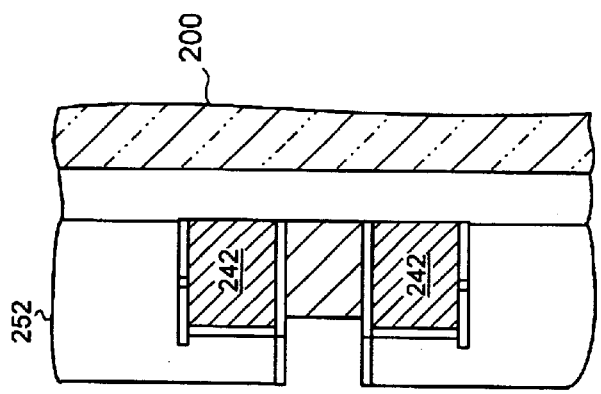

Returning to FIG. 2, the next step 132 is to etch the remaining dielectric cap above the strong gate polysilicon. This etch preferably removes the dielectric cap without removing all of the thicker dielectric above the source/drain region. This etch is preferably done by performing an anisotropic reactive ion etch of the silicon nitride. Turning now to FIGS. 19A, 19B and 19C, the wafer portion 200 is illustrated after the remaining nitride cap 224 has been etched to expose the strong gate polysilicon 222. This etch also removes a portion of the dielectric 252, but a layer of the dielectric 252 above the source/drain regions 242 remains due to the originally greater thickness of dielectric 252.

Figure 20C:
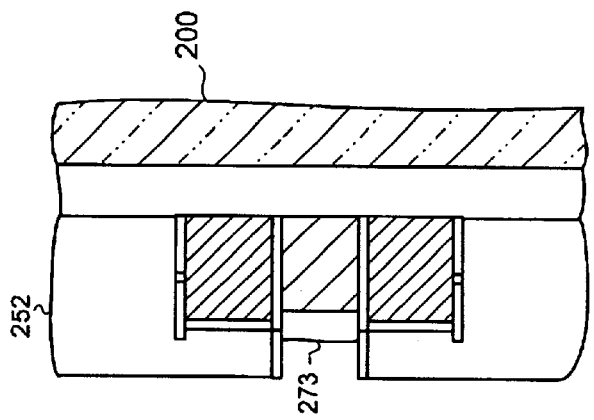
Figure 20A:
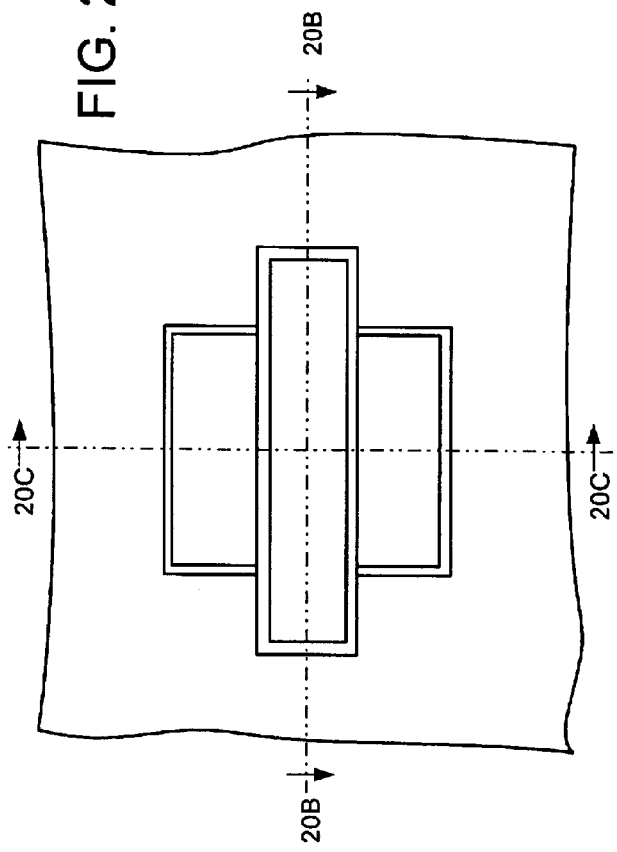
Figure 20B:
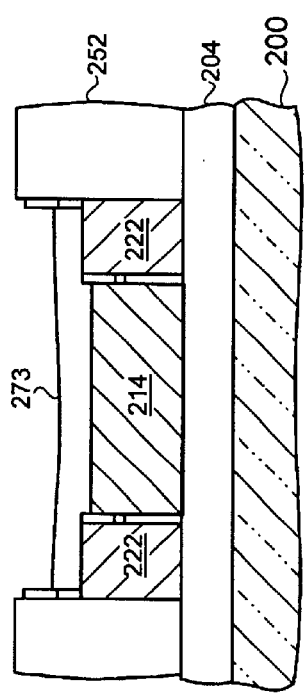

Returning to FIG. 2, the next step 134 is to selectively grow silicon on the exposed gate regions. Typically, this silicon would be grown to a thickness of between 10 to 50 nm. This silicon will the be used to form silicide that will connect the weak and strong gates of the transistor. Turning now to FIGS. 20A, 20B and 20C, the wafer portion 200 is illustrated after silicon 273 has been grown over the exposed weak gate regions 222 and strong gate regions 214.

Figure 21C:
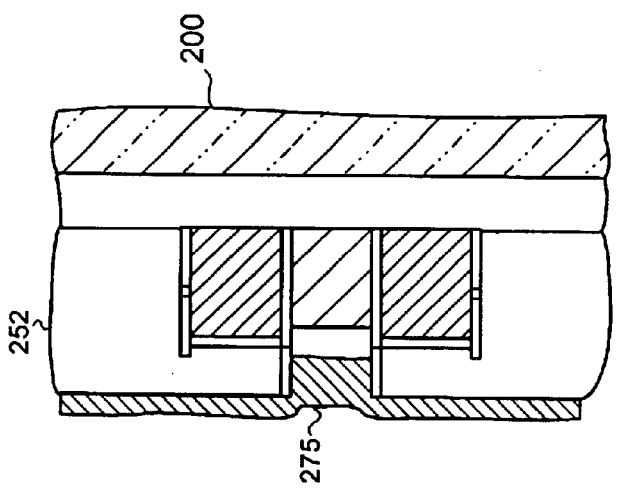
Figure 21A:
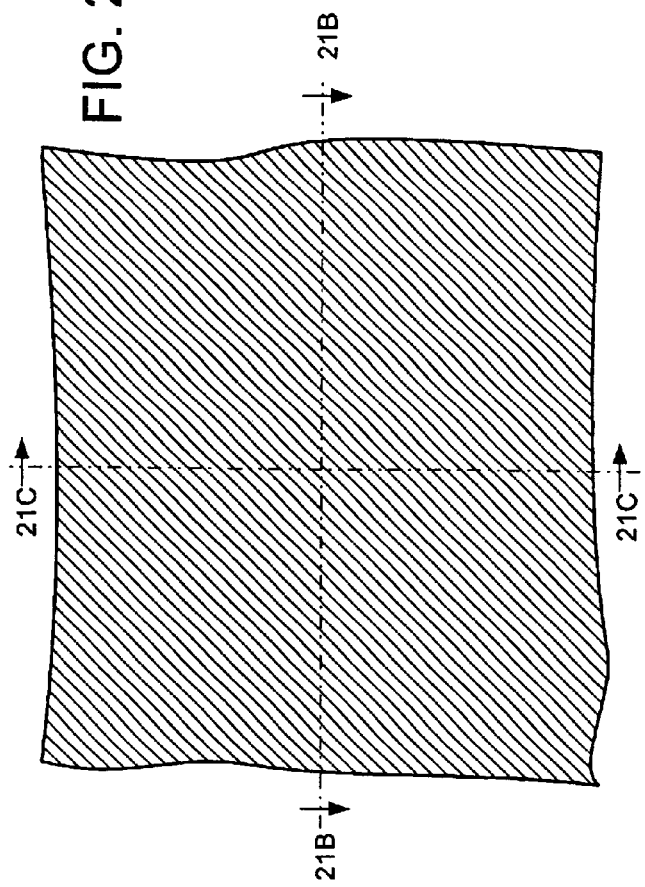
Figure 21B:
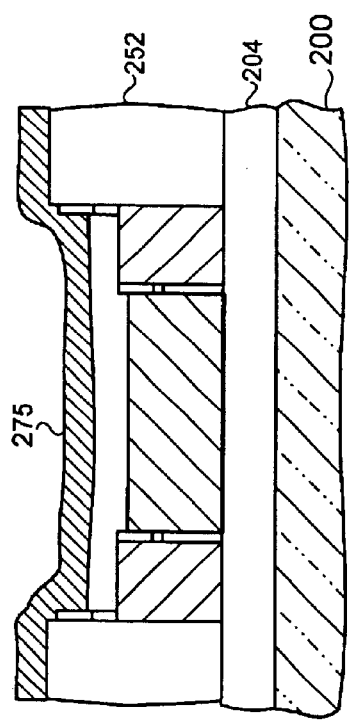

Returning to FIG. 2, the next step 136 is deposit an appropriate metal sufficient to completely consume the grown silicon. This metal typically would comprise cobalt, titanium or other metal that can be used to form silicide. The metal can be deposited using any suitable method, such as by sputtering. Turning now to FIGS. 21A, 21B and 21C, the wafer portion 200 is illustrated after metal 275 has been deposited over the silicon 273.

Returning to FIG. 2, the next step 138 is to form silicide by annealing the wafer at temperatures typically between 600 C and 750 C to form metal silicide compound in those regions where the metal overlies silicon directly. This forms silicide only where silicon was formed, and thus only over the gate portions of the device. The remaining portions of metal are then removed by an etch which selectively removes the portions of the metal that have not been converted to metal-silicide but leaves the metal-silicide compound. Turning now to FIGS. 22A, 22B and 22C, the wafer portion 200 is illustrated silicide 277 has been formed and the remaining portions of metal removed. The silicide 277 provides an electrical connection between the weak gate 214 and the strong gate 222.

Figure 23C:
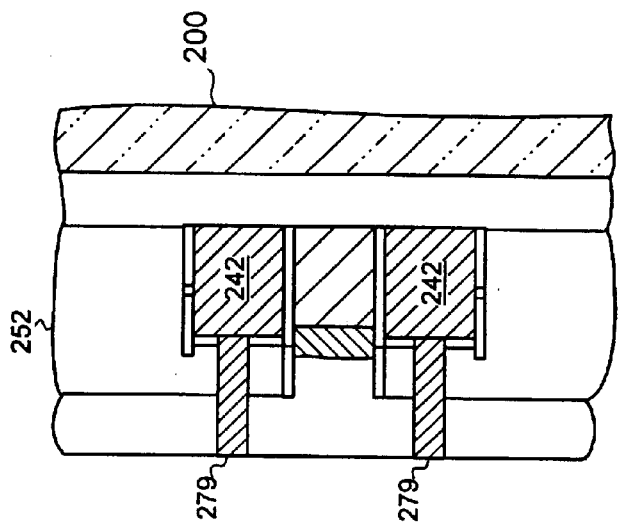
Figure 23A:
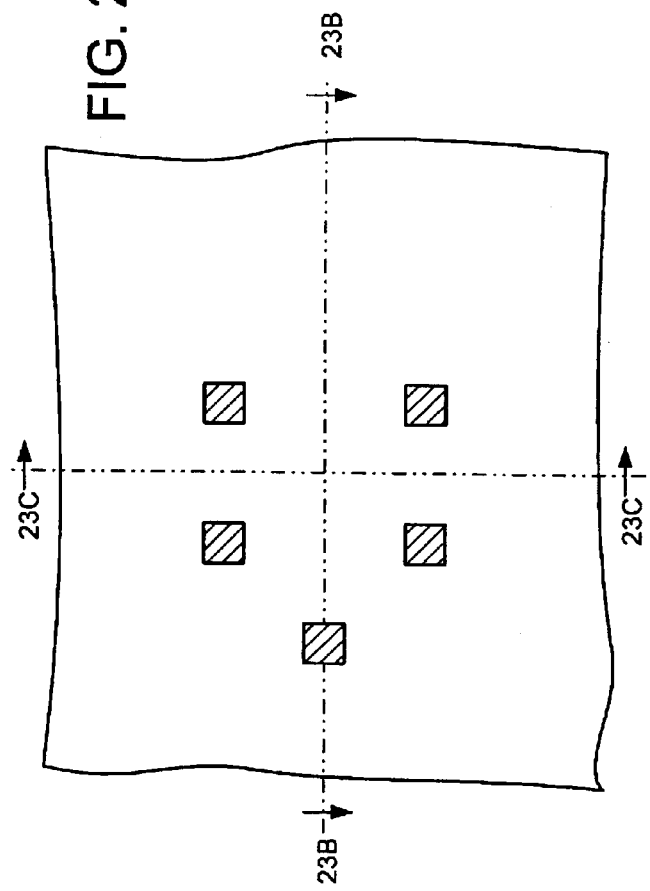
Figure 23B:
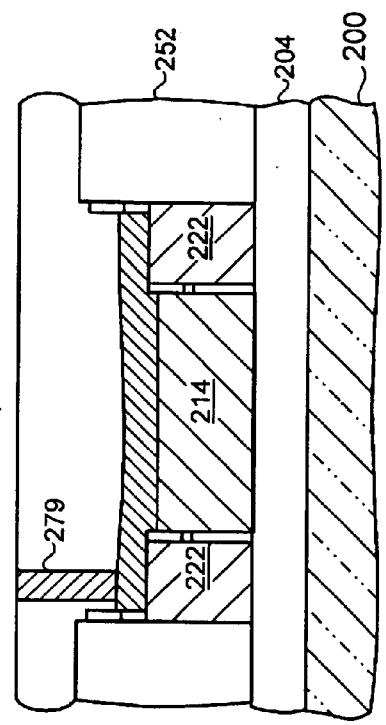

Returning to FIG. 2, the next step 140 is to complete the transistors and perform back end of line processing. In this example, a thick insulating layer, such as silicon dioxide, is deposited over the structures and planarized. A mask is then used to define and etch vias to the source, drain and/or gate regions. The vias are then filled with a conducting set of materials such as titanium nitride followed by tungsten, and planarized again. Turning now to FIGS. 23A, 23B and 23C, the wafer portion 200 is illustrated after exemplary vertical interconnect vias 279 have been formed to connect to the various components of the transistors to the wiring layers. Specifically, vias 279 have been formed to connect to the weak gates 214, a strong gate 222 (by way of silicide 277), and the source/drain regions 242.

Thus, the present invention provides a method for forming double gated, asymmetric transistor and a method for forming the same that results in improved device performance and density. The preferred embodiment of the present invention provides a double gated transistor with asymmetric gate doping, where one of the double gates is doped degenerately n-type and the other degenerately p-type. Additionally, the preferred transistor design uses an asymmetric structure that results in reduced gate-to-drain and gate-to-source capacitance. In particular, dimensions of the weak gate, the gate that has a workfunction less attractive to the channel carriers, are reduced such that the weak gate does not overlap the source/drain regions of the transistor. In contrast the strong gate, the gate having a workfunction that causes the inversion layer to form adjacent to it, is formed to slightly overlap the source/drain regions. This asymmetric structure allows for the performance benefits of a double gate design without the increased capacitance that would normally result.

While the invention has been particularly shown and described with reference to an exemplary embodiment using a fin type double gated field effect transistor, those skilled in the art will recognize that the preferred embodiment can be applied to other types of double gated transistors, and that changes in implementation details may be made therein without departing from the spirit and scope of the invention. For example, it will also be understood by those skilled in the art that the invention is applicable to different isolation technologies (e.g., LOCOS, recessed oxide (ROX), etc.), well and substrate technologies, dopant types, energies and species. It will also be understood that the spirit of the invention is applicable to other semiconductor technologies (e.g., BiCMOS, bipolar, silicon on insulator (SOI), silicon germanium (SiGe)).

What is claimed is:

1. A method for forming a transistor, the method comprising the steps of:
   a) forming a transistor body on a substrate, the transistor body having a first vertical edge and a second vertical edge, and a first end and a second end;
   b) implanting a source at the first end of the transistor body, and implanting a drain at the second end of the transistor body;
   c) forming a first gate structure adjacent the transistor body first vertical edge, the first gate structure having a first workfunction, and wherein the first gate structure overlaps the source and the drain; and
   d) forming/a second gate structure adjacent the transistor body second vertical edge, the second,gate structure having a second workfunction different from the first workfunction, and wherein the second gate structure does not overlap the source or the drain.

2. The method of claim 1 wherein the first gate structure of a first workfunction comprises p-type material and wherein the second gate structure of a second workfunction comprises n-type material.

3. The method of claim 1 wherein the first gate structure of a workfunction level comprises n-type material and wherein the second gate structure of a second workfunction comprises p-type material.

4. The method of claim 1 wherein the substrate comprises a silicon-on-insulator layer, and wherein the step of forming a transistor body comprises patterning the silicon-on-insulator using sidewall image transfer.

5. The method of claim 1 further comprising the steps of forming a first gate dielectric layer on the first body edge and forming a second gate dielectric layer on the second body edge.

6. The method of claim 5 further comprising the step of forming a first spacer between the source contact structure and the second gate structure, and forming a second spacer between the drain contact structure and the second gate structure.

7. The method of claim 1 forming a wherein the step of forming a source and forming a drain comprises forming an source implant formed in the transistor body at the first end and forming a drain implant in the transistor body at the second end.

8. The method of claim 7 further comprising the step of forming a source contact structure adjacent the source and forming a drain contact structure adjacent the drain.

9. A method for forming a field effect transistor, the method comprising the steps of:
   a) providing a semiconductor substrate;
   b) patterning the semiconductor substrate to provide a first vertical body edge;
   c) providing a weak gate structure of a first workfunction adjacent said first vertical body edge, the weak gate structure having a first side and a second side;
   d) forming a first spacer adjacent the first side of the weak gate structure and forming a second spacer adjacent the second side of the weak gate structure;
   e) patterning the semiconductor substrate to provide a second vertical body edge, the first and second vertical body edges of the semiconductor substrate defining a transistor body,
   f) providing a strong gate structure of a second workfunction adjacent said second vertical body edge; and
   g) forming a source implant into a first end of the transistor body and forming a drain implant into a second end of the transistor body, and wherein the strong gate structure overlaps the source and drain implants and wherein the weak gate structure does not overlap the source or drain implants.

10. The method of claim 9 wherein the weak gate structure of a first workfunction comprises p-type material and wherein the strong gate structure of a second workfunction comprises n-type material.

11. The method of claim 9 wherein the weak gate structure of a first workfunction comprises n-type material and wherein the strong gate structure of a second work function comprises p-type material.

12. The method of claim 9 further comprising the steps of forming a source contact adjacent the source and forming a drain contact adjacent the drain, and wherein the source and drain contacts are separated from the weak gate structure by the first and second spacers.

13. The method of claim 9 wherein the semiconductor substrate comprises a silicon-on-insulator layer, and wherein the step of patterning the semiconductor substrate to provide a first body edge comprises patterning the silicon-on-insulator layer and wherein the step of patterning the semiconductor substrate to provide a second body edge comprises pattering the silicon-on-insulator layer.

14. The method of claim 9 further comprising the steps of comprising the steps of forming a first gate dielectric layer on the first vertical body edge and forming a second gate dielectric layer on the second vertical body edge.

* * * * *